US012616012B2

(12) United States Patent　(10) Patent No.:　US 12,616,012 B2
Sharma et al.　(45) Date of Patent:　Apr. 28, 2026

(54) STACKED RANDOM ACCESS MEMORY DEVICES WITH MULTILAYER CONTINUOUS VIAS

(71) Applicant: Intel Corporation, Santa Clara, CA (US)

(72) Inventors: Abhishek A. Sharma, Hillsboro, OR (US); Clifford Lu Ong, Portland, OR (US); Van H. Le, Beaverton, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1059 days.

(21) Appl. No.: 17/406,558

(22) Filed: Aug. 19, 2021

(65) Prior Publication Data

US 2023/0056640 A1　Feb. 23, 2023

(51) Int. Cl.
　*H10B 43/27*　(2023.01)
　*G11C 11/408*　(2006.01)
　　(Continued)

(52) U.S. Cl.
　CPC ........ *H01L 23/481* (2013.01); *G11C 11/4087* (2013.01); *G11C 11/412* (2013.01);
　　(Continued)

(58) Field of Classification Search
　CPC . G11C 11/4087; G11C 11/412; G11C 11/418; G11C 5/025; H01L 21/8221; H01L 25/50; H01L 25/0657; H01L 25/0652; H01L 25/071; H01L 25/074; H01L 25/117; H01L 25/18; H01L 27/0688; H01L 21/185; H01L 21/187; H01L 21/2007; H01L 24/80; H01L 24/89; H01L 24/08; H01L 24/09; H01L 24/73; H01L 2224/08145–08148; H01L 2224/80895; H01L 2224/80896; H01L 23/481; H01L 21/76898; H01L 2224/29009; H01L 2224/29025;

(Continued)

(56) References Cited

U.S. PATENT DOCUMENTS 11,322,483 B1 * 5/2022 Ogawa .................... H01L 24/80
2008/0067573 A1 * 3/2008 Jang ........................ H10B 41/40
257/E21.691

(Continued)

FOREIGN PATENT DOCUMENTS

KR　20100075209 A　*　7/2010　............. H10D 88/00

*Primary Examiner* — Wael M Fahmy
*Assistant Examiner* — Aneesa Riaz Baig
(74) *Attorney, Agent, or Firm* — Akona IP PC

(57)　ABSTRACT

Described herein are stacked memory devices that include some peripheral devices for controlling the memory in a separate layer from one or more memory arrays. The layers of the memory device are connected together using vias, which transfer power and data between the layers. In some examples, a portion of the peripheral devices are included in a memory layer, and another portion are included in a peripheral device layer. Multiple layers of memory arrays and/or peripheral devices may be included, e.g., one peripheral device layer may control multiple layers of memory arrays, or different layers of memory arrays may have dedicated peripheral device layers. Different types of memory arrays, such as DRAM or SRAM, may be included.

20 Claims, 26 Drawing Sheets

(51) Int. Cl.

| | |
|---|---|
| *G11C 11/412* | (2006.01) |
| *G11C 11/418* | (2006.01) |
| *H01L 21/768* | (2006.01) |
| *H01L 23/48* | (2006.01) |
| *H01L 25/00* | (2006.01) |
| *H01L 25/065* | (2023.01) |
| *H10B 41/27* | (2023.01) |
| *H10B 41/30* | (2023.01) |
| *H10B 41/35* | (2023.01) |
| *H10B 43/30* | (2023.01) |
| *H10B 43/35* | (2023.01) |

(52) U.S. Cl.
CPC ...... *G11C 11/418* (2013.01); *H01L 21/76898* (2013.01); *H01L 25/0652* (2013.01); *H01L 25/50* (2013.01)

(58) Field of Classification Search
CPC ........... H01L 23/49827; H01L 23/5384; H01L 29/4175; H01L 2225/06541–06544; H01L 2225/06548; H01L 21/486; H10D 88/00; H10D 89/10

USPC .................................................. 365/189.011
See application file for complete search history.

(56) References Cited

U.S. PATENT DOCUMENTS

| | | | | |
|---|---|---|---|---|
| 2015/0129878 A1* | 5/2015 | Shin | ........................ | H10B 41/20 |
| | | | | 257/329 |
| 2016/0338202 A1* | 11/2016 | Park | ........................ | H01L 24/00 |
| 2019/0131308 A1* | 5/2019 | Fardad | .................. | G11C 29/12 |
| 2020/0098762 A1* | 3/2020 | Sharma | ................. | H10B 12/50 |
| 2020/0098776 A1* | 3/2020 | Sugisaki | ............... | H10B 43/35 |
| 2020/0203329 A1* | 6/2020 | Kanamori | ............. | H10D 88/00 |
| 2020/0279850 A1* | 9/2020 | Sharma | ............... | H10D 86/441 |
| 2020/0328186 A1* | 10/2020 | Liu | ........................ | H01L 24/83 |
| 2021/0104543 A1* | 4/2021 | Xiao | .................... | H10D 84/038 |
| 2021/0202457 A1* | 7/2021 | Choi | ....................... | H01L 24/05 |
| 2022/0139441 A1* | 5/2022 | Ogawa | ............... | G11C 11/4094 |
| | | | | 365/185.23 |
| 2022/0399310 A1* | 12/2022 | Sharma | ................. | H01L 23/481 |
| 2023/0005545 A1* | 1/2023 | Wang | .................... | H10B 41/27 |

\* cited by examiner

1000

| Memory Cells 1010a | Col I/O 1030a | Memory Cells 1010b |
| Row Decoder 1020a | Control 1040 | Row Decoder 1020b |
| Memory Cells 1010c | Col I/O 1030b | Memory Cells 1010d |

FIG. 10

STACKED RANDOM ACCESS MEMORY DEVICES WITH MULTILAYER CONTINUOUS VIAS

BACKGROUND

Embedded memory is important to the performance of modern system-on-a-chip (SoC) technology. Typically, memory assemblies (e.g., static random-access memory (SRAM) and dynamic random-access memory (DRAM)) include one or more memory arrays and control circuitry for the memory arrays in a single layer. Low power and high-density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 10 provides a plan view of a memory array, according to some embodiments of the present disclosure.

DETAILED DESCRIPTION

Overview

Figure 1:
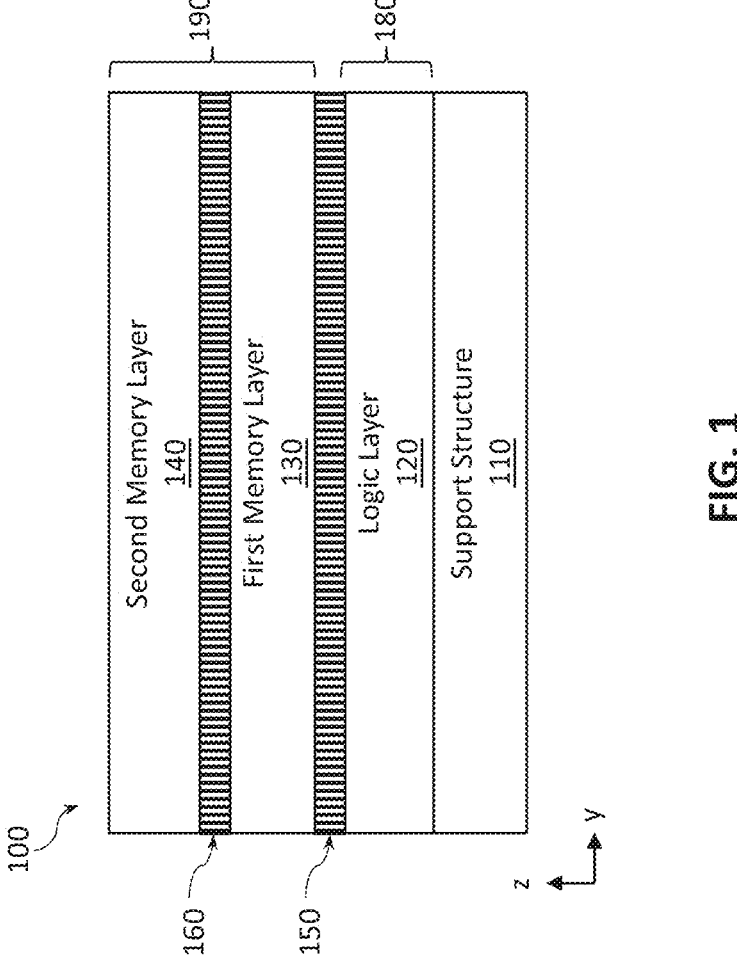
FIG. 1 provides a schematic illustration of an integrated circuit (IC) device with a logic layer and multiple layers of memory attached using hybrid bonding, according to some embodiments of the present disclosure.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Embodiments of the present disclosure are applicable to different types of memory devices. Some embodiments of the present disclosure may refer to SRAM and in particular, embedded SRAM (eSRAM). Other embodiments of the present disclosure may refer to DRAM and in particular, embedded DRAM (eDRAM). However, embodiments of the present disclosure may be equally applicable to memory cells implemented other technologies. Thus, in general, memory cells/arrays described herein may be implemented as standalone SRAM devices, eSRAM devices, non-volatile SRAM devices, DRAM devices, or any other volatile or non-volatile memory cells/arrays.

An SRAM memory cell includes a plurality of transistors for storing a bit value or a memory state (e.g., logic "1" or "0") of the cell, and one or more access transistors for controlling access to the cell (e.g., access to write information to the cell or access to read information from the cell). A typical SRAM memory cell is made up of 6 transistors and is, therefore, may be referred to as a "6T SRAM memory cell," where 4 transistors are used to store a bit value and 2 transistors are access transistors, coupled to a bitline (BL) and a wordline (WL). Various SRAM memory cells have, conventionally, been implemented with transistors being front end of line (FEOL), logic-process based, transistors implemented in an upper-most layer of a semiconductor substrate.

A DRAM memory cell may include a capacitor for storing a bit value or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source/drain (S/D) region/terminal of the access transistor (e.g., to the source region of the access transistor), while the other S/D region of the access transistor may be coupled to a bitline (BL), and a gate terminal of the transistor may be coupled to a wordline (WL). Since such a memory cell can be fabricated with as little as a single access transistor, it can provide higher density and lower standby power versus some other types of memory in the same process technology, e.g., SRAM. Various 1T-1C memory cells have, conventionally, been implemented with access transistors being FEOL, logic-process based, transistors implemented in an upper-most layer of a semiconductor substrate.

One challenge common to SRAM and DRAM cells resides in that, given a usable surface area of a substrate, there are only so many FEOL transistors that can be formed in that area, placing a significant limitation on the density of memory cells incorporating such transistors. In conventional solutions, attempts to increase memory density have included decreasing the critical dimensions of the memory cells, which requires ever-increasing process complexity and cost, resulting in diminishing returns and expected slow pace of memory scaling for future nodes.

In SRAM and DRAM devices, a portion of the surface area of the substrate is used for peripheral circuitry, e.g., circuitry for controlling the memory cells. Peripheral circuitry may include input/output (I/O) circuitry, mid-logic, repeaters, self-test circuitry, and voltage regulation circuitry. This peripheral circuitry constrains the surface area that can be devoted to memory cells. In addition, fabricating the peripheral circuitry in the same layer as the memory cells may add complexity and cost to the process. For example, I/O circuitry often operates at a higher voltage than the memory cells, and thus the I/O transistors have a longer channel length and thicker gate dielectric than the channel length and gate dielectric of transistors in the memory cells (e.g., the access transistors in the DRAM cells or transistors M1-M6 in the SRAM cells). Therefore, I/O transistors are processed in a separate step from the memory cells. The processing of the peripheral circuitry can also put stress on the memory cells, which may lead to damage.

Embodiments of the present disclosure may improve on at least some of the challenges and issues described above by separating at least some of the peripheral circuitry of memory devices to a separate layer, providing a vertically-stacked memory design. As described herein, a memory device may include a first layer that includes peripheral circuitry, such as input and output circuitry, repeaters, voltage blocks, etc., and a second layer that includes one or more memory arrays. The first layer and second layer are coupled by vias that pass signals between the two layers. Some peripheral circuitry, such as mid-logic, may be included in the memory layer. In some embodiments, a single peripheral layer may support multiple layers with memory cells. In other embodiments, multiple peripheral layers may support one layer of memory cells, or multiple layers of memory cells. The memory devices disclosed herein enable greater flexibility for circuit designers and can enable greater memory density for a given surface area, by freeing up area that was previously devoted to peripheral circuitry and moving it to a second layer. The memory arrangements are suitable for different memory technologies, such as DRAM and SRAM.

In the following, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

As used herein, the term "metal layer" may refer to a layer above a support structure that includes electrically conductive interconnect structures for providing electrical connectivity between different IC components. Metal layers described herein may also be referred to as "interconnect layers" to clearly indicate that these layers include electrically conductive interconnect structures which may but does not have to be metal.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 11A-11B, such a collection may be referred to herein without the letters, e.g., as "FIG. 11."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with stacked memory devices as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example IC with Stacked Memory Structure

FIG. 1 provides a schematic illustration of an IC device 100 with a logic layer and multiple layers of memory attached using hybrid bonding, according to some embodiments of the present disclosure. As shown in FIG. 1, in general, the IC device 100 may include a support structure 110, a logic layer 120, a first memory layer 130, and a second memory layer 140.

Implementations of the present disclosure may be formed or carried out on the support structure 110, which may be, e.g., a substrate, a die, a wafer or a chip. The support structure 110 may, e.g., be the wafer 2000 of FIG. 20A, discussed below, and may be, or be included in, a die, e.g., the singulated die 2002 of FIG. 20B, discussed below. The support structure 110 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 110 may be a printed circuit board (PCB) substrate. Although a few examples of materials from which the substrate may be formed are described here, any material that may serve as a foundation upon which a semiconductor device implementing any of the stacked memory devices as described herein may be built falls within the spirit and scope of the present disclosure.

The first and second memory layers 130, 140 may, together, be seen as forming a memory structure 190. As such, the memory structure 190 may include various memory cells (e.g., SRAM cells or DRAM cells, as described further herein) that are coupled to wordlines (WLs) (e.g., row selectors) and bitlines (BLs) (e.g., column selectors). The memory structure 190 further comprises peripheral devices for accessing, controlling, and testing the memory cells. As described herein, at least some of the peripheral devices may be in a different layer from at least some of the memory cells, e.g., the first memory layer 130 may be a peripheral device layer while the second memory layer 140 includes one or more arrays of memory cells, or vice versa. The logic layer 120 may be a compute logic layer that may include various logic layers, circuits, and devices (e.g., logic transistors) to drive and control a logic IC. For example, the logic layer 120 may include a central processing unit (CPU) and/or a graphics processing unit (GPU). In some embodiments, an IC with a stacked memory as described herein may omit the logic layer 120, e.g., the IC device may be a dedicated memory device rather than a device that includes both memory and computation circuitry.

In some embodiments, the compute logic layer 120 may be provided in a FEOL layer and in one or more lowest back end of line (BEOL) layers (i.e., in one or more BEOL layers which are closest to the support structure 110), while the first memory layer 130 and the second memory layer 140 may be seen as provided in respective BEOL layers. Various BEOL layers may be, or include, metal layers. Various metal layers of the BEOL may be used to interconnect the various inputs and outputs of the logic devices in the compute logic layer 120 and/or of the memory cells in the memory layers 130 and/or 140. In particular, these metal layers may connect to the interconnects 150 that couple the compute logic layer 120 and the first memory layer 130. Additional metal layers in the first memory layer 130 and second memory layer 140 connect to the interconnects 160 that couple the first memory layer 130 to the second memory layer 140. In some embodiments, a portion of the interconnects 150 may extend from the compute logic layer 120 through the first memory layer 130 into higher memory layers, e.g., the second memory layer 140, as the interconnects 160.

Generally speaking, each of the metal layers of the BEOL may include a via portion and a trench portion. The trench portion of a metal layer is configured for transferring signals and power along electrically conductive (e.g., metal) lines (also sometimes referred to as "trenches") extending in the x-y plane (e.g., in the x- or y-directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL may include only certain patterns of conductive metals, e.g., copper (Cu), aluminum (Al), Tungsten (W), or Cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

The interconnects 150 and/or 160 may be formed using hybrid bonding. Hybrid bonding involves bonding dies with ICs formed thereon. The dies may be formed by different processes and then combined, thus achieving various functionalities (e.g., logic and memory) in the bonded combination. The interconnects 150 and/or 160 may include power vias for transferring power between layers and signal vias for transferring data signals between layers. In general, cross-sectional dimensions (e.g., diameters) and a pitch (e.g., defined as a center-to-center distance) of power vias are larger than cross-sectional dimensions and a pitch of signal vias. For example, in some embodiments, the pitch of the power vias extending through the bonding interface of the compute logic layer 120 and the first memory layer 130 may be between about 10 and 25 micron, e.g., between about 15 and 20 micron, while the pitch of the signal vias may be between about 2 and 12 micron, e.g., between about 4 and 9 micron. In some embodiments, the cross-sectional dimensions (e.g., diameters) of the power vias may be between about 7 and 11 micron, e.g., about 9 micron, while the cross-sectional dimensions of the signal vias may be between about 2 and 4 micron, e.g., about 3 micron. In some embodiments, the cross-sectional dimension may be between about 45%-55% of the pitch.

After vias are formed in a particular IC structure (e.g., the compute logic layer 120 or the first memory layer 130), the faces of the IC structures that are joined at the bonding interface may be grinded so that electrical connections can be made between vias of adjoining IC structures, e.g., at the interconnects 150. Grinding a face of an IC structure to reveal the vias may be performed using any suitable thinning/polishing processes as known in the art.

In addition to providing the interconnects 150 to transfer signal and/or power between the compute logic layer 120 and the first memory layer 130, the compute logic layer 120 is further physically bonded to the first memory layer 130.

In particular, an upper face of the compute logic layer 120 (e.g., the face opposite the support structure 110) is bonded to a lower face of the first memory layer 130. Similarly, an upper face of the first memory layer 130 is bonded to a lower face of the second memory layer 140. The bonding may be performed using insulator-insulator bonding, e.g., as oxide-oxide bonding, where an insulating material of a first IC structure (e.g., the compute logic layer 120) is bonded to an insulating material of a second IC structure (e.g., the memory layer 130). In some embodiments, a bonding material may be present in between the faces of the first and second IC structures that are bonded together. The interconnects 150 or 160 extend through the bonding material and into the surrounding layers, e.g., the interconnects 150 extend into the compute logic layer 120 and the first memory layer 130, and the interconnects 160 extend into the first memory layer 130 and the second memory layer 140.

To bond two IC structures together, the bonding material may be applied to one or both faces of the first and second IC structures that should be bonded (e.g., to the lower face of the first memory layer 130 and/or the upper face of the compute logic layer 120). After the bonding material is applied, the first and second IC structures are put together, possibly while applying a suitable pressure and heating up the assembly to a suitable temperature (e.g., to relatively low temperatures, e.g., between about 50 and 200 degrees Celsius) for a duration of time. In some embodiments, the bonding material may be an adhesive material that ensures attachment of the first and second IC structures to one another. In some embodiments, the bonding material may be an etch-stop material. In some embodiments, the bonding material may be both an etch-stop material and have suitable adhesive properties to ensure attachment of the first and second IC structures to one another.

The bonding material may have a thickness between 50 nm and 1000 nm. In some embodiments, the bonding material has a thickness between 100 nm and 300 nm, e.g., the bonding material has a thickness of about 200 nm.

In some embodiments, the bonding material includes silicon in combination with one or more of oxygen, nitrogen, and carbon. The bonding material may be a polyimide, an epoxy polymer, or any underfill material. The bonding material may have a dielectric constant in the range of 1.5 to 8. In some embodiments, the bonding material has a dielectric constant that is less than 3.9, e.g., in the range of 1.5 to 3.9.

In some embodiments, the bonding material may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, could be a characteristic feature of the hybrid bonding. Using an etch-stop material at the interface that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the first and second IC structures together. In addition, an etch-stop material at the interface between the first and second IC structures that includes include silicon, nitrogen, and carbon, where the atomic percentage of any of these materials may be at least 1%, may be advantageous in terms of improving etch-selectivity of this material with respect to etch-stop materials that may be used in different of the first and second IC structures.

In some embodiments, no bonding material may be used, but there will still be a bonding interface resulting from the bonding of the layers to one another. Such a bonding interface may be recognizable as a seam or a thin layer in the microelectronic assembly, using, e.g., selective area diffraction (SED), even when the specific materials of the insulators of the first and second IC structures that are bonded together may be the same, in which case the bonding interface would still be noticeable as a seam or a thin layer in what otherwise appears as a bulk insulator (e.g., bulk oxide) layer.

In other embodiments of the IC device 100, compute logic devices may be provided in a layer above the memory layers 130, 140, in between memory layers 130, 140, or combined with the memory layers 130, 140.

The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers. For example, although two memory layers 130, 140 are shown in FIG. 1, in various embodiments, the IC device 100 may include any other number of one or more of such memory layers.

Example IC Device with Stacked Peripheral Layer and DRAM Layer

Figure 2:
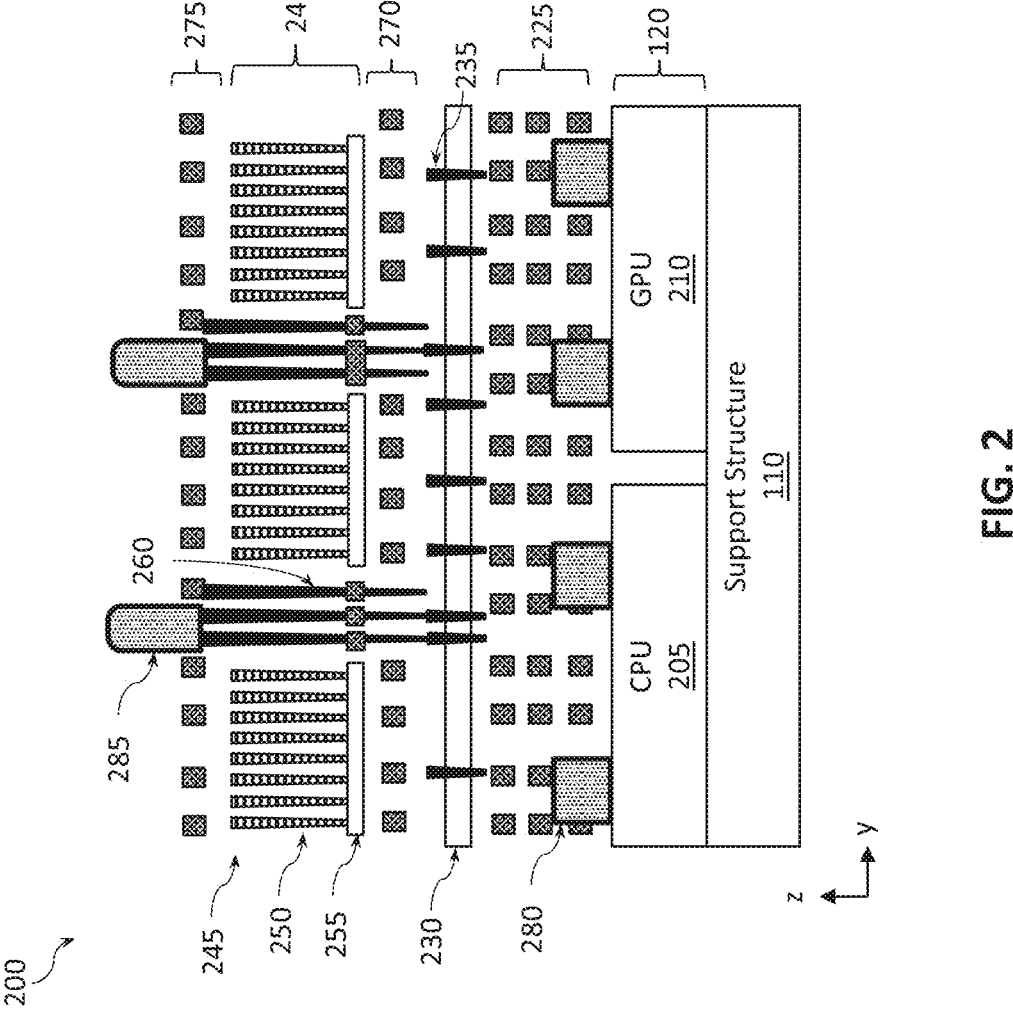
FIG. 2 provides an example cross-section of the IC device with embedded DRAM arrays stacked over a peripheral device layer and the logic layer, according to some embodiments of the present disclosure.

FIG. 2 provides an example cross-section of the IC device 200 with embedded DRAM arrays stacked over a peripheral device layer and the logic layer, according to some embodiments of the present disclosure. FIG. 2 includes the support structure 110 and logic layer 120 of FIG. 1. In this example, the logic layer 120 includes a CPU 205 and a GPU 210. In other embodiments, the logic layer 120 may include only a CPU 205, only a GPU 210, or a different type of processing circuitry. In other embodiments, the logic layer 120 may include other combinations of processing circuitry.

FIG. 2 illustrates two layers that make up a memory structure: a peripheral device layer 230 and a DRAM layer 240. The peripheral device layer 230 may correspond to the first memory layer 130 shown in FIG. 1, and the DRAM layer 240 may correspond to the second memory layer 140 shown in FIG. 1. Additional peripheral device layers and/or DRAM layers may be included in the IC device 200, e.g., above and/or below the peripheral device layer 230 and DRAM layer 240.

Figure 3:
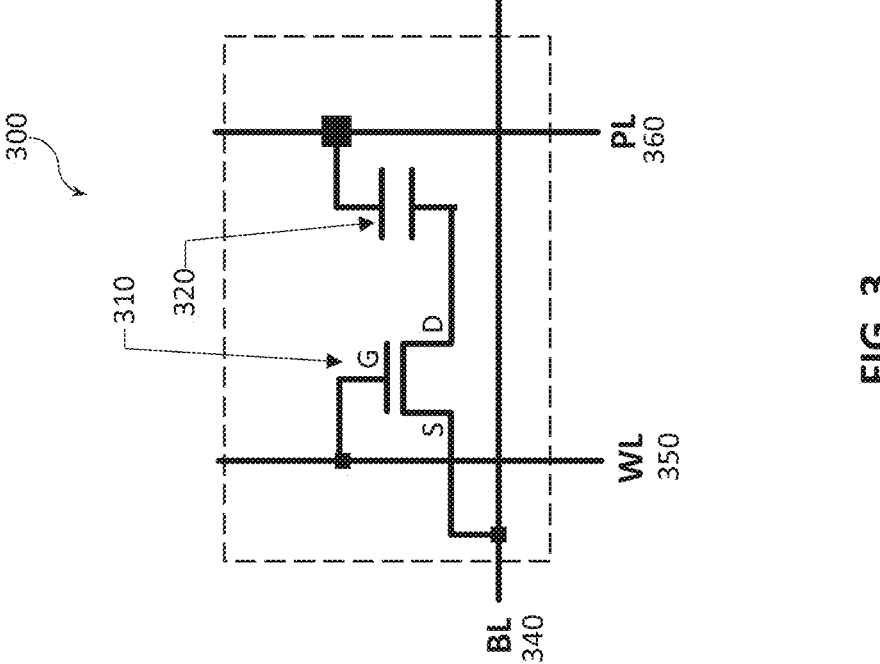
FIG. 3 is an electrical circuit diagram of an example one access transistor (1T) and one capacitor (1C) (1T-1C) memory cell, according to some embodiments of the present disclosure.
Figure 4:
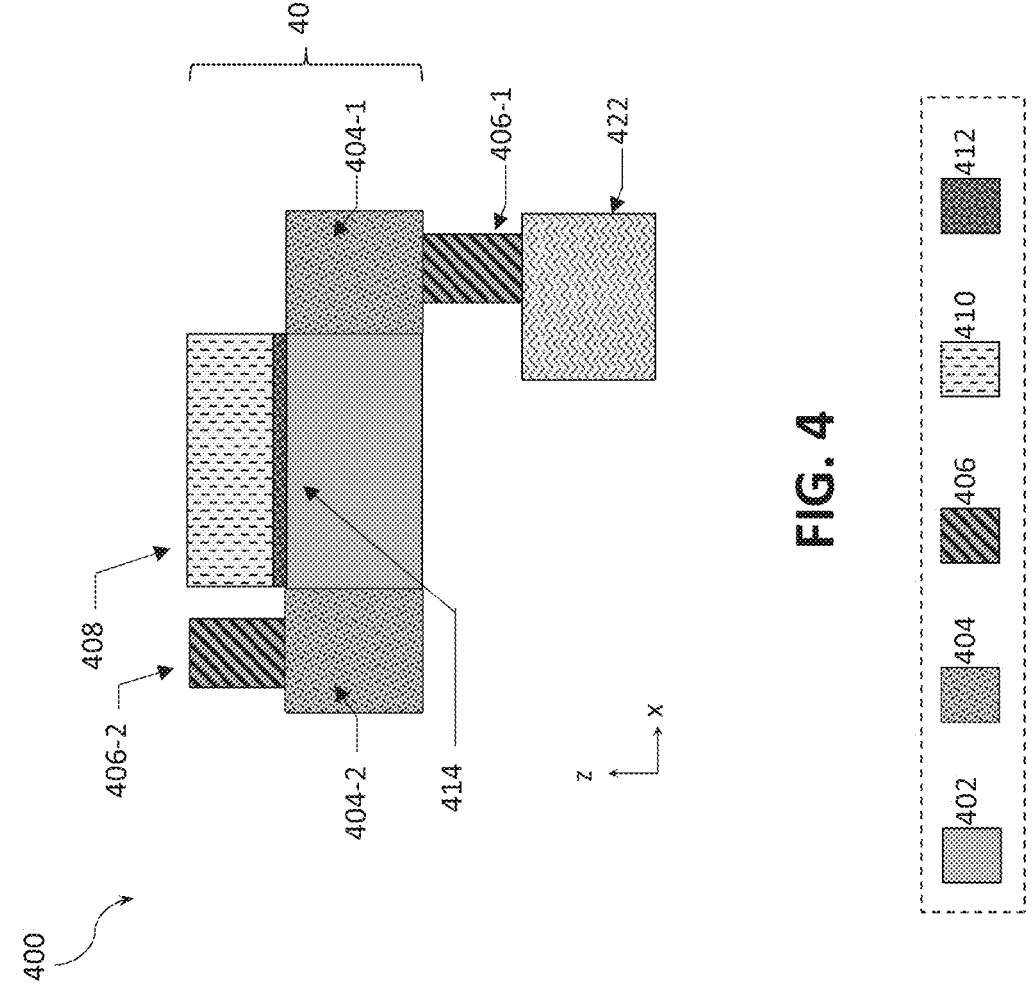
FIG. 4 provides a schematic illustration of a cross-sectional view of an example 1T-1C memory cell, according to some embodiments of the present disclosure.

The DRAM layer 240 includes several DRAM arrays 245. While the DRAM layer 240 shown in FIG. 2 includes three DRAM arrays 245, in other embodiments, a DRAM layer 240 may include more or fewer DRAM arrays 245. Each DRAM array 245 includes a set of capacitors, e.g., capacitor 250, and an array of access transistors 255. Each memory cell includes an access transistor from the array 255 and a capacitor 250, thus forming a 1T-1C memory cell. An example circuit diagram of a DRAM memory cell is shown in FIG. 3, and an example perspective view of one implementation of a 1T-1C memory cell is shown in FIG. 4. The DRAM array 245 may further include some control circuitry, e.g., a row decoder, column input/output, and timing circuitry. An example layout for a memory array is shown in FIG. 10.

The peripheral device layer 230 includes one or more sets of peripheral devices associated with the DRAM arrays 245, e.g., devices for accessing the DRAM arrays 245. In typical DRAM arrangements, peripheral devices are included in the same layer as the DRAM arrays 245, e.g., in the DRAM layer 240. In various embodiments described herein, different groups of peripheral circuits are included instead in a separate peripheral device layer 230. Example arrangements of memory arrays (e.g., the DRAM arrays 245) and peripheral devices are shown in FIGS. 12-19.

Moving peripheral devices to the peripheral device layer 230 can improve processing of the DRAM arrays 245 and/or the peripheral devices. For example, if peripheral devices that are fabricated using a different processing technology from the DRAM arrays 245 are moved to the peripheral device layer 230, this simplifies the processing of the DRAM layer 240, and may result in fewer defects in the DRAM arrays 245. Furthermore, moving the peripheral devices to the peripheral device layer 230 frees up space in the DRAM layer 240 to provide additional and/or larger DRAM arrays 245 and thus increase memory capacity. In addition, having a separate layer for peripheral devices increases the surface area available for the peripheral devices themselves, so circuit designers may devote more area to peripheral devices. This can lead to improved memory access, e.g., by increasing bandwidth of signals to and from the DRAM arrays 245.

A series of metal layer 225 are depicted between the logic layer 120 and the peripheral device layer 230. The metal layers 225 may be used to interconnect the various inputs and outputs of the CPU 205 and GPU 210 in the compute logic layer 120 to inputs and outputs of the peripheral device layer 230. The metal layers 225 may connect to the interconnects 150 shown in FIG. 1 that couple the compute logic layer 120 and the first memory layer 130. Additional metal layers 270 and 275 are depicted below and above the DRAM layer 240, respectively. The metal layers 225, 270, and/or 275 may be considered part of the layers above or below them. For example, the metal layers 225 may be considered part of the logic layer 120 or part of the peripheral device layer 230, or the metal layer 270 may be considered part of the peripheral device layer 230 or the DRAM layer 240.

In the cross-section shown in FIG. 2, the trenches in the metal layers 225, 270, and 275 are depicted as extending into and/or out of the page, i.e., in the x-direction in the reference coordinate system of FIG. 2. In some embodiments, one or more trenches in any of the metal layers 225, 270, and 275 may extend in the y-direction.

Figure 7:
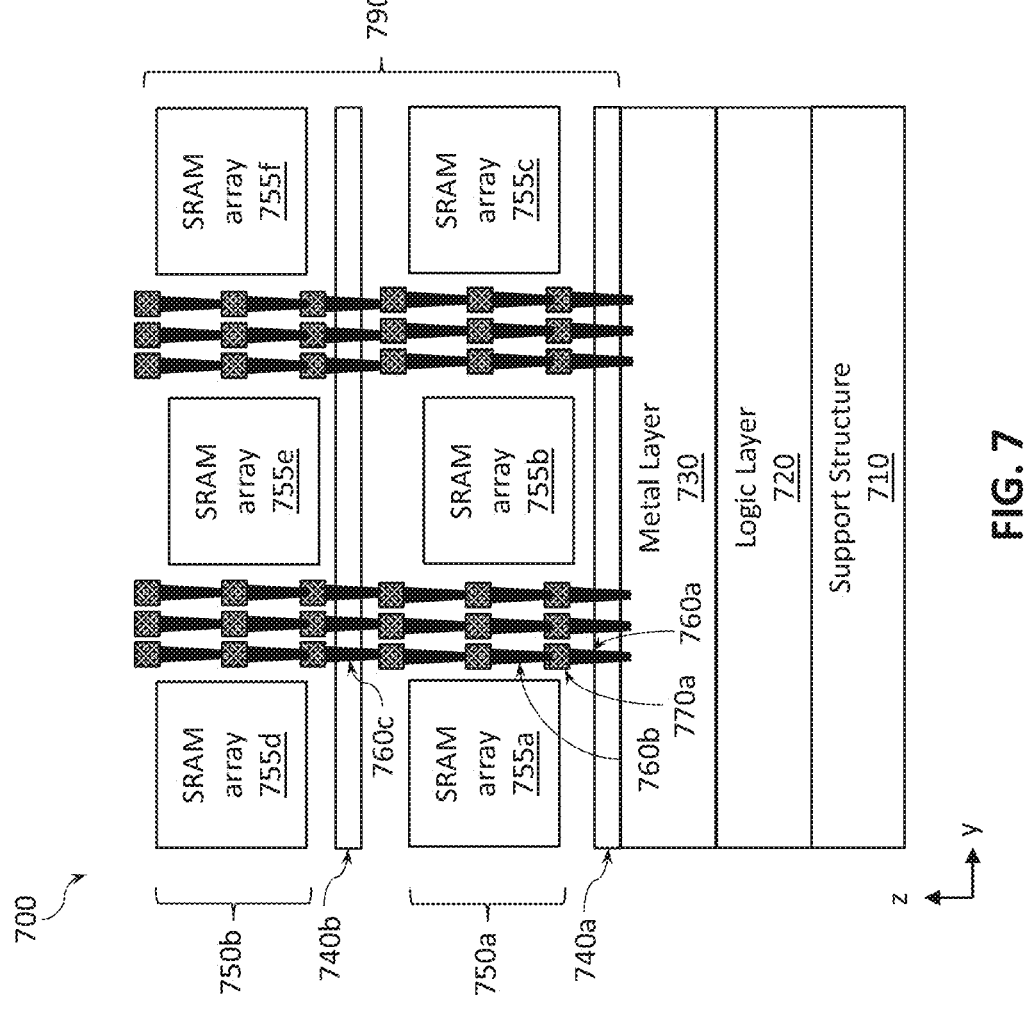
FIG. 7 provides an example cross-section of an IC device with SRAM layers stacked over respective peripheral device layers, according to some embodiments of the present disclosure.

FIG. 2 also depicts example vias extending in the z-direction. A set of vias 235 extend through the peripheral device layer 230. At least some of the vias 235 may connect to portions of the metal layer 225 to transmit signals and/or power to different regions of the peripheral device layer 230 and/or to transmit signals and/or power to the logic layer 120. At least some of the vias 235 may connect to portions of the metal layer 270 to transmit signals and/or power to different regions of the peripheral device layer 230 and/or to transmit signals and/or power to the DRAM layer 240. An additional set of vias 260 extends through the DRAM layer 240, e.g., from the metal layer 275 to the metal layer 270. The vias 260 are shown extending along the sides of the DRAM arrays 245 and have a greater length than the heights of the DRAM arrays 245. In other embodiments, the vias 260 may be processed as a series of shorter vias connected by metal interconnects, e.g., as shown in FIG. 7. The vias 260 and/or 235, and/or any of the other vias described herein (e.g., the vias shown in FIGS. 7-9), may be adjacent to a keep-out section in one or more of the layers the vias extend through. The keep-out section is a portion of a device layer (e.g., a peripheral layer or a memory layer) that does not include logic elements, because logic elements in the keep-out section may be damaged by via formation (e.g., mechanical or heat stress during via formation, or leakage of gasses used in etching the vias into the area around the via).

FIG. 2 further depicts several example solder bumps 280 between the metal layers 225 and the logic layer 120, e.g., between the metal layers 225 the CPU 205 and GPU 210. The solder bumps 280 provide electrical connectivity between the logic layer 120 and the higher layers, e.g., to the peripheral device layer 230. The solder bumps 280 may transfer power and/or logic signals between the logic layer 120 and the peripheral device layer 230. As described with respect to FIG. 1, in some embodiments, hybrid bonding is used to couple the logic layer 120 and the memory structure 190; in such embodiments, the solder bumps 280 may not be present.

FIG. 2 depicts additional solder bumps 285 above the DRAM layer 240 and connecting to the metal layer 275. The solder bumps 285 may transfer power and/or logic signals between the DRAM layer 240 and one or more additional layers or devices coupled to the solder bumps 285, e.g., the solder bumps 285 may receive power from an external power source and deliver the power to the DRAM layer 240 and/or lower layers. For example, as depicted in FIG. 2, each of the solder bumps 285 is connected to two of the vias 260, which are in contact with to the vias 235 extending through the peripheral device layer 230. Power and/or data signals may travel from the solder bumps 285 through the vias 260 and 235 to the peripheral device layer 230. In some embodiments, either the solder bumps 285 or the solder bumps 280 are included, but not both; in some embodiments, neither the solder bumps 285 or the solder bumps 280 are present.

Example 1T-1C DRAM Memory Cell

FIG. 3 is an electrical circuit diagram of an example one access transistor (1T) and one capacitor (1C) (1T-1C) memory cell 300, according to some embodiments of the present disclosure. The 1T-1C cell 300 is an example DRAM memory cell that may be included in a DRAM array 245 shown in FIG. 2.

As shown, the 1T-1C cell 300 may include an access transistor 310 and a capacitor 320. The access transistor 310 has a gate terminal, a source terminal, and a drain terminal, indicated in the example of FIG. 3 as terminals G, S, and D, respectively. In the following, the terms "terminal" and "electrode" may be used interchangeably. Furthermore, for S/D terminals, the terms "terminal" and "region" may be used interchangeably.

As shown in FIG. 3, in the 1T-1C cell 300, the gate terminal of the access transistor 310 may be coupled to a WL 350, one of the S/D terminals of the access transistor 310 may be coupled to a BL 340, and the other one of the S/D terminals of the access transistor 310 may be coupled to a first electrode of the capacitor 220. As also shown in FIG. 3, the other electrode of the capacitor 320 may be coupled to a capacitor plateline (PL) 360. As is known in the art, WL, BL, and PL may be used together to read and program the capacitor 320.

Each of the BL 340, the WL 350, and the PL 360, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

The access transistor 310 may be a nanoribbon-based transistor (or, simply, a nanoribbon transistor, e.g., a nanowire transistor). In a nanoribbon transistor, a gate stack that may include a stack of one or more gate electrode metals and, optionally, a stack of one or more gate dielectrics may be provided around a portion of an elongated semiconductor structure called "nanoribbon", forming a gate on all sides of the nanoribbon. The portion of the nanoribbon around which the gate stack wraps around is referred to as a "channel" or a "channel portion." A semiconductor material of which the channel portion of the nanoribbon is formed is commonly referred to as a "channel material." A source region and a drain region are provided on the opposite ends of the nanoribbon, on either side of the gate stack, forming, respectively, a source and a drain of such a transistor. Wrap-around or all-around gate transistors, such as nanoribbon and nanowire transistors, may provide advantages compared to other transistors having a non-planar architecture, such as FinFETs.

FIG. 4 provides a schematic illustration of a cross-sectional view of an example 1T-1C memory cell 400, in accordance with some embodiments. FIG. 4 illustrates a transistor 401, which is an example of the transistor 310 shown in FIG. 3, and a capacitor 422, which is an example of the capacitor 320 shown in FIG. 3. In this example, the capacitor 422 is coupled to a back-side S/D contact 406-1 of the transistor 401.

In general, a field-effect transistor (FET), e.g., a metal oxide semiconductor (MOS) FET (MOSFET), is a three-terminal device that includes source, drain, and gate terminals and uses electric field to control current flowing through the device. A FET typically includes a channel material, a source region and a drain region provided in the channel material, and a gate stack that includes a gate electrode material, alternatively referred to as a "work function" material, provided over a portion of the channel material between the source and the drain regions, and, optionally, also includes a gate dielectric material between the gate electrode material and the channel material. This general structure of the transistor 401 is shown in FIG. 4, illustrating a channel material 402, S/D regions 404 (shown as a first S/D region 404-1, e.g., a source region, and a second S/D region 404-2, e.g., a drain region), contacts 406 to S/D regions (shown as a first S/D contact 406-1, providing electrical contact to the first S/D region 404-1, and a second S/D contact 406-2, providing electrical contact to the second S/D region 404-2), and a gate stack 408, which includes at least a gate electrode 410 and may also, optionally, include a gate dielectric 412.

In some embodiments, the channel material 402 may be composed of semiconductor material systems including, for example, N-type or P-type materials systems. In some embodiments, the channel material 402 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 402 may include a combination of semiconductor materials where one semiconductor material may be used for the channel portion (e.g., a portion 414 shown in FIG. 4, which is supposed to refer to the upper-most portion of the channel material 402) and another material, sometimes referred to as a "blocking material," may be used between the channel portion 414 and the support structure over which the transistor 401 is provided. In some embodiments, the channel material 402 may include a monocrystalline semiconductor, such as silicon (Si) or germanium (Ge). In some embodiments, the channel material 402 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 401 is an N-type metal oxide semiconductor (NMOS)), the channel portion 414 of the channel material 402 may advantageously include a III-V material having a high electron mobility, such as, but not limited to InGaAs, InP, InSb, and InAs. For some such embodiments, the channel portion 414 of the channel material 402 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion 414 of the channel material 402 may be an intrinsic III-V material, i.e., a III-V semiconductor material not intentionally doped with any electrically active impurity. In alternate embodiments, a nominal impurity dopant level may be present within the channel portion 414 of the channel material 402, for example to further fine-tune a threshold voltage Vt, or to provide HALO pocket implants, etc. Even for impurity-doped embodiments however, impurity dopant level within the channel portion 414 of the channel material 402 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 401 is a P-type metal oxide semiconductor (PMOS)), the channel portion 414 of the channel material 402 may advantageously be a group IV material having a high hole mobility, such as, but not limited to Ge or a Ge-rich SiGe alloy. For some example embodiments, the channel portion 414 of the channel material 402 may have a Ge content between 0.6 and 0.9, and advantageously may be at least 0.7. In some embodiments with highest mobility, the channel portion 414 may be intrinsic III-V (or IV for P-type devices) material and not intentionally doped with any electrically active impurity. In alternate embodiments, one or more a nominal impurity dopant level may be present within the channel portion 414, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the transistor 401 may be a thin film transistor (TFT). A TFT is a special kind of a FET made by depositing a thin film of an active semiconductor material, as well as a dielectric layer and metallic contacts, over a supporting layer that may be a non-conducting layer. At least a portion of the active semiconductor material forms a channel of the TFT. If the transistor 401 is a TFT, the channel material 402 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 401 is a TFT, the channel material 402 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 402 may have a thickness between about 5 and 75 nanometers, including all values and ranges therein. In some embodiments, a thin film channel material 402 may be deposited at relatively low temperatures, which allows depositing the channel material 402 within the thermal budgets imposed on back end fabrication to avoid damaging other components, e.g., front end components such as the logic devices.

As shown in FIG. 4, a first and a second S/D regions 404-1, 404-2 (together referred to as "S/D regions 404") may be included on either side of the gate stack 408, thus realizing a transistor. As is known in the art, source and drain regions (also sometimes interchangeably referred to as "diffusion regions") are formed for the gate stack of a FET. In some embodiments, the S/D regions 404 of the transistor 401 may be regions of doped semiconductors, e.g. regions of the channel material 402 (e.g., of the channel portion 414) doped with a suitable dopant to a suitable dopant concentration, so as to supply charge carriers for the transistor channel. In some embodiments, the S/D regions 404 may be highly doped, e.g. with dopant concentrations of about $1 \cdot 10^{21}$ cm$^{-3}$, in order to advantageously form Ohmic contacts with the respective S/D contacts 406, although, in other embodiments, these regions may also have lower dopant concentrations and may form Schottky contacts in some implementations. Irrespective of the exact doping levels, the S/D regions 404 of the transistor 401 may be the regions having dopant concentration higher than in other regions, e.g. higher than a dopant concentration in a region of the channel material 402 between the first S/D region 404-1 and the second S/D region 404-2, and, therefore, may be referred to as "highly doped" (HD) regions. In some embodiments, the S/D regions 404 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the channel material 402 to form the S/D regions 404. An annealing process that activates the dopants and causes them to diffuse further into the channel material 402 may follow the ion implantation process. In the latter process, the one or more semiconductor materials of the channel material 402 may first be etched to form recesses at the locations for the future S/D regions. An epitaxial deposition process may then be carried out to fill the recesses with material (which may include a combination of different materials) that is used to fabricate the S/D regions 404. In some implementations, the S/D regions 404 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 404 may be formed using one or more alternate semiconductor materials such as germanium or a group III-V material or alloy. Although FIG. 4 illustrates the first and second S/D regions 404 with a single pattern, suggesting that the material composition of the first and second S/D regions 404 is the same, this may not be the case in some other embodiments of the transistor 401. Thus, in some embodiments, the material composition of the first S/D region 404-1 may be different from the material composition of the second S/D region 404-2.

As further shown in FIG. 4, S/D contacts 406-1 and 406-2 (together referred to as "S/D contacts 406"), formed of one or more electrically conductive materials, may be used for providing electrical connectivity to the S/D regions 404-1 and 404-2, respectively. In various embodiments, one or more layers of metal and/or metal alloys may be used to form the S/D contacts 406. For example, the electrically conductive materials of the S/D contacts 406 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 406 may include one or more electrically conductive alloys, oxides, or carbides of one or more metals. In some embodiments, the S/D contacts 406 may include a doped semiconductor, such as silicon or another semiconductor doped with an N-type dopant or a P-type dopant. Metals may provide higher conductivity, while doped semiconductors may be easier to pattern during fabrication. Although FIG. 4 illustrates the first and second S/D contacts 406 with a single pattern, suggesting that the material composition of the first and second S/D contacts 406 is the same, this may not be the case in some other embodiments of the transistor 401. Thus, in some embodiments, the material composition of the first S/D contact 406-1 may be different from the material composition of the second S/D contact 406-2.

Turning to the gate stack 408, the gate electrode 410 may include at least one P-type work function metal or N-type work function metal, depending on whether the transistor 401 is a PMOS transistor or an NMOS transistor. For a PMOS transistor, metals that may be used for the gate electrode 410 may include, but are not limited to, ruthenium, palladium, platinum, cobalt, nickel, and conductive metal oxides (e.g., ruthenium oxide). For an NMOS transistor, metals that may be used for the gate electrode 410 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 410 may include a stack of two or more metal layers, where one or more metal layers are WF metal layers and at least one metal layer is a fill metal layer. Further metal layers may be included for other purposes, such as to act as a diffusion barrier layer, described below.

If used, the gate dielectric 412 may at least laterally surround the channel portion 414, and the gate electrode 410 may laterally surround the gate dielectric 412 such that the gate dielectric 412 is disposed between the gate electrode 410 and the channel material 402. In various embodiments, the gate dielectric 412 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 412 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 412 during manufacture of the transistor 401 to improve the quality of the gate dielectric 412. In some embodiments, the gate dielectric 412 may have a thickness between about 0.5 nanometers and 3 nanometers, including all values and ranges therein, e.g., between about 1 and 3 nanometers, or between about 1 and 2 nanometers.

In some embodiments, the gate dielectric 412 may be a multilayer gate dielectric, e.g., it may include any of the high-k dielectric materials in one layer and a layer of IGZO. In some embodiments, the gate stack 408 may be arranged so that the IGZO is disposed between the high-k dielectric and the channel material 402. In such embodiments, the IGZO may be in contact with the channel material 402, and may provide the interface between the channel material 402 and the remainder of the multilayer gate dielectric 412. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

In some embodiments, the gate stack 408 may be surrounded by a dielectric spacer, not specifically shown in FIG. 4. The dielectric spacer may be configured to provide separation between the gate stacks 408 of different transistors 401 which may be provided adjacent to one another (e.g., different transistors 401 provided along a single fin if the transistors 401 are FinFETs), as well as between the gate stack 408 and one of the S/D contacts 406 that is disposed on the same side as the gate stack 408. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In stark contrast to conventional implementations where both S/D contacts are typically provided on a single side of a transistor, typically on the front side, e.g., where the gate stack 408 is provided, the two S/D contacts 406 are provided on different sides. Namely, as shown in FIG. 4, the second S/D contact 406-2 is provided on the same side as the gate stack 408, which may be considered to be the front side of the transistor 401, while the first S/D contact 406-1 is provided on the opposite side, which may be considered to be the back side of the transistor 401. Thus, the first S/D contact 406-1 is the back-side contact and the second S/D contact 406-2 is the front-side contact of the transistor 401. If considering the layers above a support structure (not shown in FIG. 4) over which the entire transistor 401 is built, then the first S/D contact 406-1 may be considered to be in a first layer above the support structure, the second S/D contact 406-2 may be considered to be in a second layer above the support structure, and a portion of the channel material 402 between the first S/D region 404-1 and the second S/D region 404-2 (e.g., the channel portion 414) is in a third layer over the support structure. As can be seen from FIG. 4, the third layer is between the first layer and the second layer. At least a portion of the gate stack 408, or a contact to the gate stack 408 (such a gate contact not specifically shown in FIG. 4), may be provided in the same layer as one of the S/D contacts 406.

Transistors having one front-side and one back-side S/D contacts as described herein, such as the transistor 401, may be implemented using any suitable transistor architecture, e.g. planar or non-planar architectures.

The capacitor 422 can store bit value, or a memory state (e.g., logical "1" or "0") of the memory cell 400, and the transistor 401 may then function as an access transistor controlling access to the memory cell 400 (e.g., access to write information to the cell or access to read information from the cell). By coupling the capacitor 422 to the S/D region 404-1, the capacitor 422 is configured to store the memory state of the memory cell 400. In some embodiments, the capacitor 422 may be coupled to the S/D region 404-1 via a storage node (not specifically shown in FIG. 4) coupled to the S/D region 404-1. In some embodiments, the S/D contact 406-1 may be considered to be the storage node.

Although not specifically shown in FIG. 4, the memory cell 400 may further include a bitline to transfer the memory state and coupled to the one of the S/D regions 404 to which the capacitor 422 is not coupled (e.g., to the S/D region 404-2, for the illustration of FIG. 4). Such a bitline can be connected to a sense amplifier and a bitline driver which may, e.g., be provided in a memory peripheral circuit associated with a memory array in which the memory cell 400 may be included. Furthermore, although also not specifically shown in FIG. 4, the memory cell 400 may further include a wordline, coupled to the gate terminal of the transistor 401, e.g., coupled to the gate stack 408, to supply a gate signal. The transistor 401 may be configured to control transfer of a memory state of the memory cell 400 between the bitline and the storage node or the capacitor 422 in response to the gate signal.

Example SRAM Memory Cell

As noted above, embodiments of the present disclosure are applicable to different types of memory devices. While DRAM-based memory structures with one or more peripheral device layers and one or more DRAM layers were described with respect to FIGS. 2, other types of memory may be used in other embodiments. For example, other embodiments include a memory structure with one or more peripheral device layers and one or more SRAM layers. In general, DRAM memories are capacitor-based, and SRAM memories are transistor-based, e.g., an SRAM memory cell may be formed from six transistors.

Figure 5:
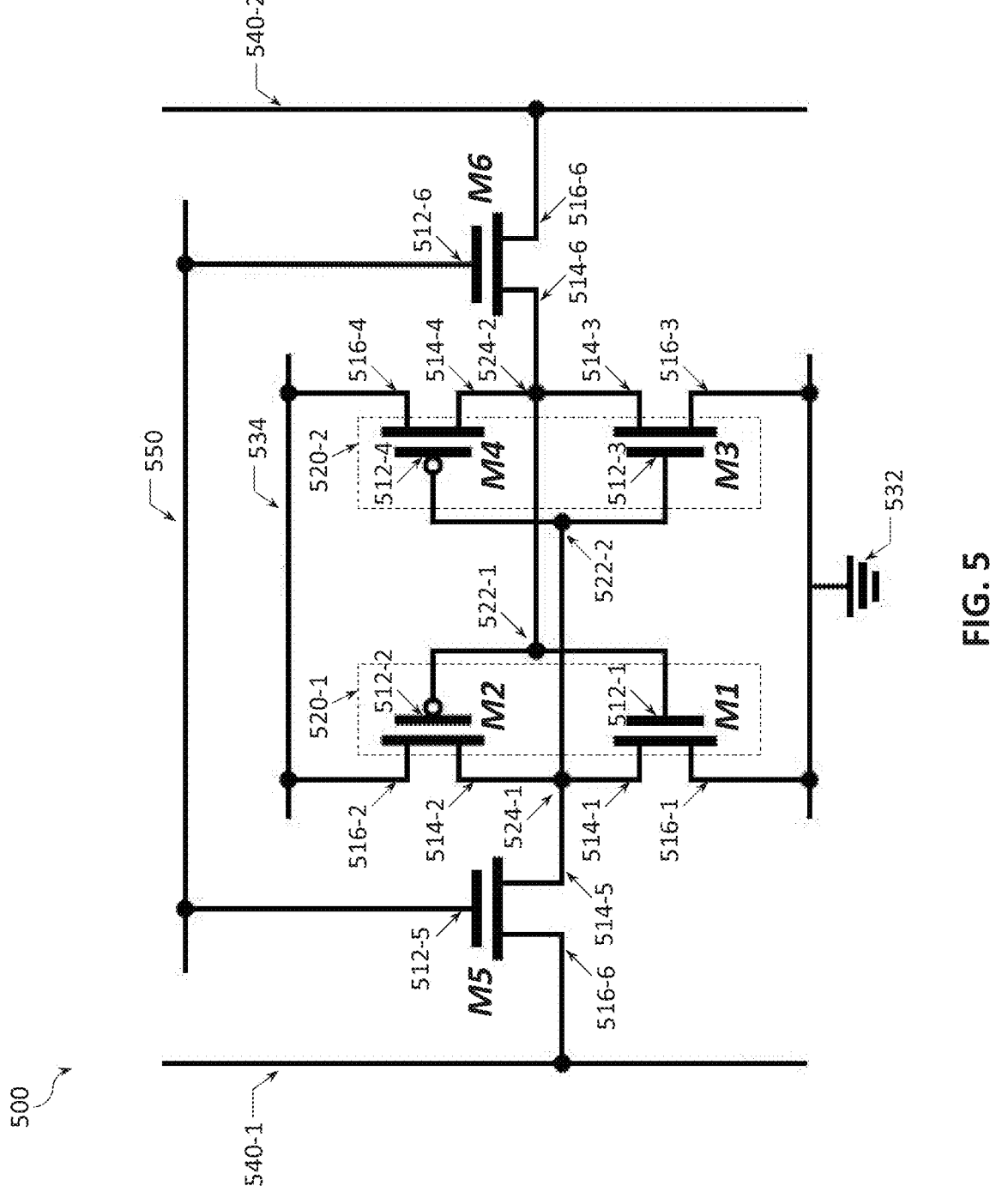
FIG. 5 is an electric circuit diagram of an example 6-transistor (6T) memory cell, according to some embodiments of the present disclosure.

FIG. 5 is an electric circuit diagram of an example 6-transistor (6T) memory cell 500 that may be an SRAM cell used in an SRAM array, according to some embodiments of the present disclosure. The SRAM cell 500 includes transistors M1-M4 for storing a bit value or a memory state (e.g., logic "1" or "0") of the cell, and two access transistors, M5 and M6, for controlling access to the cell (e.g., access to write information to the cell or access to read information from the cell 500). Each of the transistors M1-M6 may have any transistor architecture (e.g., planar or non-planar, Fin-FET, nanoribbon/nanowire, etc.). For example, the transistors M1-M6 may have the transistor architecture shown in FIG. 4 (omitting the capacitor 422).

In the SRAM cell 500, each bit may be stored on four transistors (M1, M2, M3, M4) that form two cross-coupled inverters 520, each having an input 522 and an output 524. The first inverter 520-1 may be formed by an NMOS transistor M1 and a PMOS transistor M2, while the second inverter 520-2 may be formed by an NMOS transistor M3 and a PMOS transistor M4. As shown in FIG. 5, the gate stack 512-1 of the transistor M1 may be coupled to the gate stack 512-2 of the transistor M2, and both of these gate stacks may be coupled to the input 522-1 of the first inverter 520-1. On the other hand, the first S/D region 514-1 of the transistor M1 may be coupled to the first S/D region 514-2 of the transistor M2, and both of these first S/D regions 514-1 and 514-2 may be coupled to the output 524-1 of the first inverter 520-1. Similarly, for the second inverter 320-2, the gate stack 512-3 of the transistor M3 may be coupled to the gate stack 512-4 of the transistor M4, and both of these gate stacks may be coupled to the input 522-2 of the second inverter 520-2, while the first S/D region 514-3 of the transistor M3 may be coupled to the first S/D region 514-4 of the transistor M4, and both of these first S/D regions 514-3 and 514-4 may be coupled to the output 524-2 of the second inverter 520-2. As also shown in FIG. 5, when the transistors M1 and M3 are NMOS transistors and when the transistors M2 and M4 are PMOS transistors as illustrated in FIG. 5, the second S/D regions 516-1 and 516-3 of the transistors M1 and M3 may be coupled to a ground voltage 532, while the second S/D regions 516-2 and 516-4 of the transistors M2 and M4 may be coupled to a supply voltage 534, e.g., VDD. In the embodiments of the SRAM cell 500 where the NMOS transistors shown in FIG. 5 are replaced with PMOS transistors and vice versa, the designation of the ground voltage 532 and the supply voltage 534 would be reversed as well, all of which embodiments being within the scope of the present disclosure.

The four transistors M1-M4 in such configuration form a stable storage cell for storing a bit value of 0 or 1. As further shown in FIG. 5, two additional access transistors, M5 an M6, may serve to control the access to the storage cell of the transistors M1-M4 during read and write operations. As shown in FIG. 5, the first S/D region 514-5 of the access transistor M5 may be coupled to the output 524-1 of the first inverter 520-1. Phrased differently, the first S/D region 514-5 of the access transistor M5 may be coupled to each of the first S/D region 514-1 of the transistor M1 and the first S/D region 514-2 of the transistor M2. The second S/D region 516-5 of the access transistor M5 may be coupled to a first BL 540-1. Thus, each of the first S/D region 514-1 of the transistor M1 and the first S/D region 514-2 of the transistor M2 may be coupled to the first BL 540-1 (e.g., via the access transistor M5). The gate 512-5 of the access transistor M5 may be coupled to a WL 550.

As further shown in FIG. 5, the first S/D region 514-6 of the access transistor M6 may be coupled to the output 524-2 of the second inverter 520-2. Phrased differently, the first S/D region 514-6 of the access transistor M6 may be coupled to each of the first S/D region 514-3 of the transistor M3 and the first S/D region 514-4 of the transistor M4. The second S/D region 516-6 of the access transistor M6 may be coupled to a second BL 540-2. Thus, each of the first S/D region 514-3 of the transistor M3 and the first S/D region 514-4 of the transistor M4 may be coupled to the second BL 540-2 (e.g., via the access transistor M6). The gate 512-6 of the access transistor M6 may be coupled to the WL 550. Thus, the gates 512-5 and 512-6 of both of the access transistors M5 and M6 may be coupled to a single, shared, WL, the WL 550.

As also shown in FIG. 5, the input 522-1 of the first inverter 520-1 may be coupled to the first S/D region 514-6 of the access transistor M6, while the input 522-2 of the second inverter 520-2 may be coupled to the first S/D region 514-5 of the access transistor M5. In other words, each of the gate stack 512-1 of the transistor M1 and the gate stack 512-2 of the transistor M2 may be coupled to the first S/D region 514-6 of the access transistor M6, while each of the gate stack 512-3 of the transistor M3 and the gate stack 512-4 of the transistor M4 may be coupled to the first S/D region 514-5 of the access transistor M5. Phrased differently, each of the gate stack 512-1 of the transistor M1 and the gate stack 512-2 of the transistor M2 may be coupled to the second BL 540-2 (e.g., via the access transistor M6), while each of the gate stack 512-3 of the transistor M3 and the gate stack 512-4 of the transistor M4 may be coupled to the first BL 540-1 (e.g., via the access transistor M5).

The WL 550 and the first and second BLs 540 may be used together to read and program (i.e., write to) the SRAM cell 500. In particular, access to the cell may be enabled by the WL 550 which controls the two access transistors M5 and M6 which, in turn, control whether the cell 500 should be connected to the BLs 540-1 and 540-2. During operation of the SRAM cell 500, a signal on the first BL 540-1 may be complementary to a signal on the second BL 540-2. The two BLs 540 may be used to transfer data for both read and write operations. In other embodiments of the SRAM cell 500, only a single BL 540 may be used, instead of two bitlines 540-1 and 540-2, although having one signal BL and one inverse, such as the two BLs 540, may help improve noise margins.

During read accesses, the BLs 540 are actively driven high and low by the inverters 520 in the SRAM cell 500. This may improve SRAM bandwidth compared to DRAM. The symmetric structure of the SRAMs cell 500 also allows for differential signaling, which may provide an improvement in detecting small voltage swings. Another difference with DRAM that may contribute to making SRAM faster than DRAM is that commercial chips accept all address bits at a time. By comparison, commodity DRAMs may have the address multiplexed in two halves, i.e. higher bits followed by lower bits, over the same package pins in order to keep their size and cost down.

Each of the WL 550 and the BLs 540, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

Figure 6:
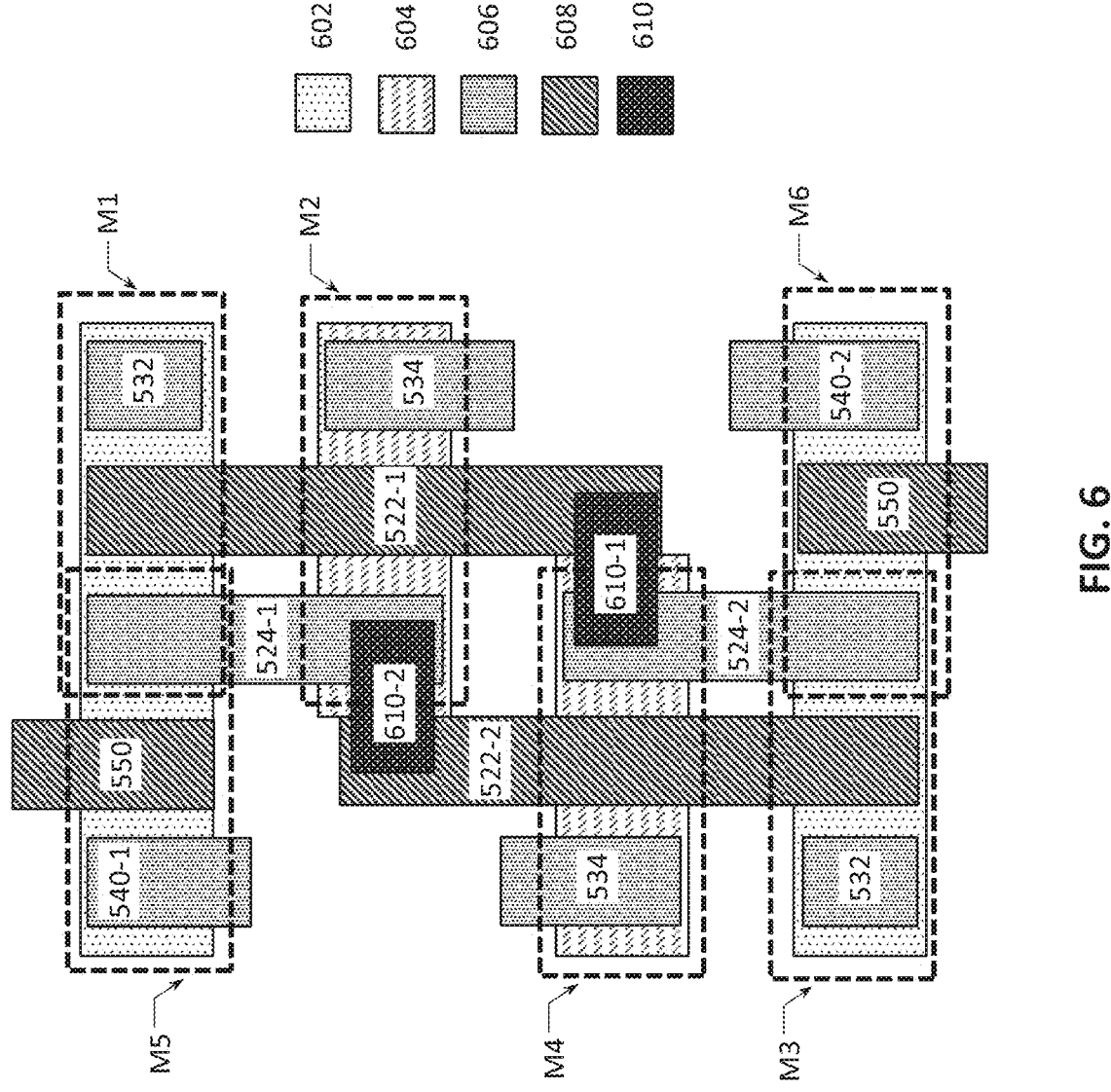
FIG. 6 provides a top-down plan view of one example implementation of a 6T memory cell, according to some embodiments of the present disclosure.

FIG. 6 provides a top-down plan view of one example implementation of a 6T memory cell, according to some embodiments of the present disclosure. FIG. 6 illustrates how the six transistors M1-M6 shown in FIG. 5 may be implemented. Several elements from FIG. 5 are labeled in FIG. 6. For example, the transistors M1-M6 are labeled in FIG. 6, with the approximate boundaries of the individual transistors shown in FIG. 6 with dashed rectangles. Certain elements, e.g., the specific S/D regions 514 and 512 and the gate stacks 516, are not labeled in FIG. 6 in order to not clutter the drawings.

FIG. 6 illustrates that transistors M1 and M5 may be provided along a first region of an N-type semiconductor 602, transistors M2 and M4 may each be provided along a respective first and second region of a P-type semiconductor 604, and the transistors M4 and M6 may be provided along a second region of the N-type semiconductor 602. Each of the regions of the N-type semiconductor 602 and P-type semiconductor 604 may be formed in a support structure (e.g., a substrate) or over a support structure, e.g., as a fin or nanoribbon. The N-type semiconductor 602 is suitable for forming transistors of a first type, e.g., NMOS transistors, while the P-type semiconductor 604 is suitable for forming transistors of a second type, e.g., PMOS transistors, thus realizing NMOS transistors M1, M3, M5, and M6, and PMOS transistors M2 and M4, as shown in FIG. 5.

In the plan view shown in FIG. 6, S/D contacts 606, gate electrodes 608, and interconnects 610 are formed over the N-type and P-type semiconductors 602 and 604, e.g., as layers processed over the N-type and P-type semiconductors 602 and 604. While not specifically shown in FIG. 6, S/D regions may be formed under the S/D contacts 606, and gate dielectrics may be formed under the gate electrodes 608. Any of the materials and processes described with respect to FIG. 4 may be used to form the transistors shown in FIG. 6.

More specifically, a shared gate stack may be used to realize the gate stack 512-1 of the transistor M1 coupled to the gate stack 512-2 of the transistor M2. The shared gate stack is labelled 522-1 in FIG. 6, representing a node that is the input 522-1 of the first inverter 520-1 of the SRAM cell 500. Similarly, a shared gate stack may be used to realize the gate stack 212-3 of the transistor M3 coupled to the gate stack 212-4 of the transistor M4 3. The shared gate stack is labelled 522-2 in FIG. 6, representing a node that is the input 522-2 of the second inverter 520-2 of the SRAM cell 500.

As also shown in FIG. 6, a first shared S/D contact may be used to realize the first S/D region 514-1 of the transistor M1 coupled to the first S/D region 514-2 of the transistor M2. The first shared S/D contact is labelled 524-1 in FIG. 6, representing a node that is the output 524-1 of the first inverter 520-1 of the SRAM cell 500. Similarly, a second shared S/D contact may be used to realize the first S/D region 514-3 of the transistor M3 coupled to the first S/D region 514-4 of the transistor M4. The first shared S/D contact is labelled 524-2 in FIG. 6, representing a node that is the output 524-2 of the second inverter 520-2 of the SRAM cell 500.

A first interconnect 610-1, shown in FIG. 6, may then be used to couple the shared gate stack 522-1 of the first inverter 520-1 to the shared S/D contact 524-2 of the second inverter 520-2, thus realizing the coupling of the input 522-1 of the first inverter 520-1 to the output 524-2 of the second inverter 520-2, shown in FIG. 5. Similarly, a second interconnect 610-2, shown in FIG. 6, may then be used to couple the shared gate stack 522-2 of the second inverter 520-2 to the shared interconnect 524-1 of the first inverter 520-1, thus realizing the coupling of the input 522-2 of the second inverter 520-2 to the output 524-1 of the first inverter 520-1, shown in FIG. 5.

FIG. 6 further illustrates that, in a given SRAM cell 500, the first S/D region 514-5 of the transistor M5 may be shared with (e.g., be the same as) the first S/D region 514-1 of the transistor M1 (since both of these transistors are implemented in a single region of the N-type semiconductor 602). In addition, the first S/D region 514-3 of the transistor M3 may be shared with (e.g., be the same as) the first S/D region 514-6 of the transistor M6 (since both of these transistors are implemented in a single region of the N-type semiconductor 602).

Both of the second S/D region 516-1 of the transistor M1 and the second S/D region 516-3 of the transistor M3 may be coupled to the ground potential 532, as was described with reference to FIG. 5. Both of the second S/D region 516-2 of the transistor M2 and the second S/D region 516-4 of the transistor M4 may be coupled to the supply voltage 534, as was described with reference to FIG. 5.

Example IC Device with Stacked Peripheral Layers and SRAM Layers

FIG. 7 provides an example cross-section of an IC device 700 with embedded SRAM layers stacked over respective peripheral device layers, according to some embodiments of the present disclosure. FIG. 7 includes a support structure 710, a logic layer 720, and a metal layer 730. The support structure 710 may be similar to the support structure 110 described in relation to FIGS. 1 and 2, and the logic layer 720 may be similar to the logic layer 120 described in relation to FIGS. 1 and 2. In some embodiments, the logic layer 720 may be omitted, e.g., if the IC device 700 is a dedicated SRAM memory device rather than a device that includes both memory and computation circuitry. FIG. 7 further includes a metal layer 730, which may be similar to the metal layer 225 described with respect to FIG. 2.

Figure 19A:
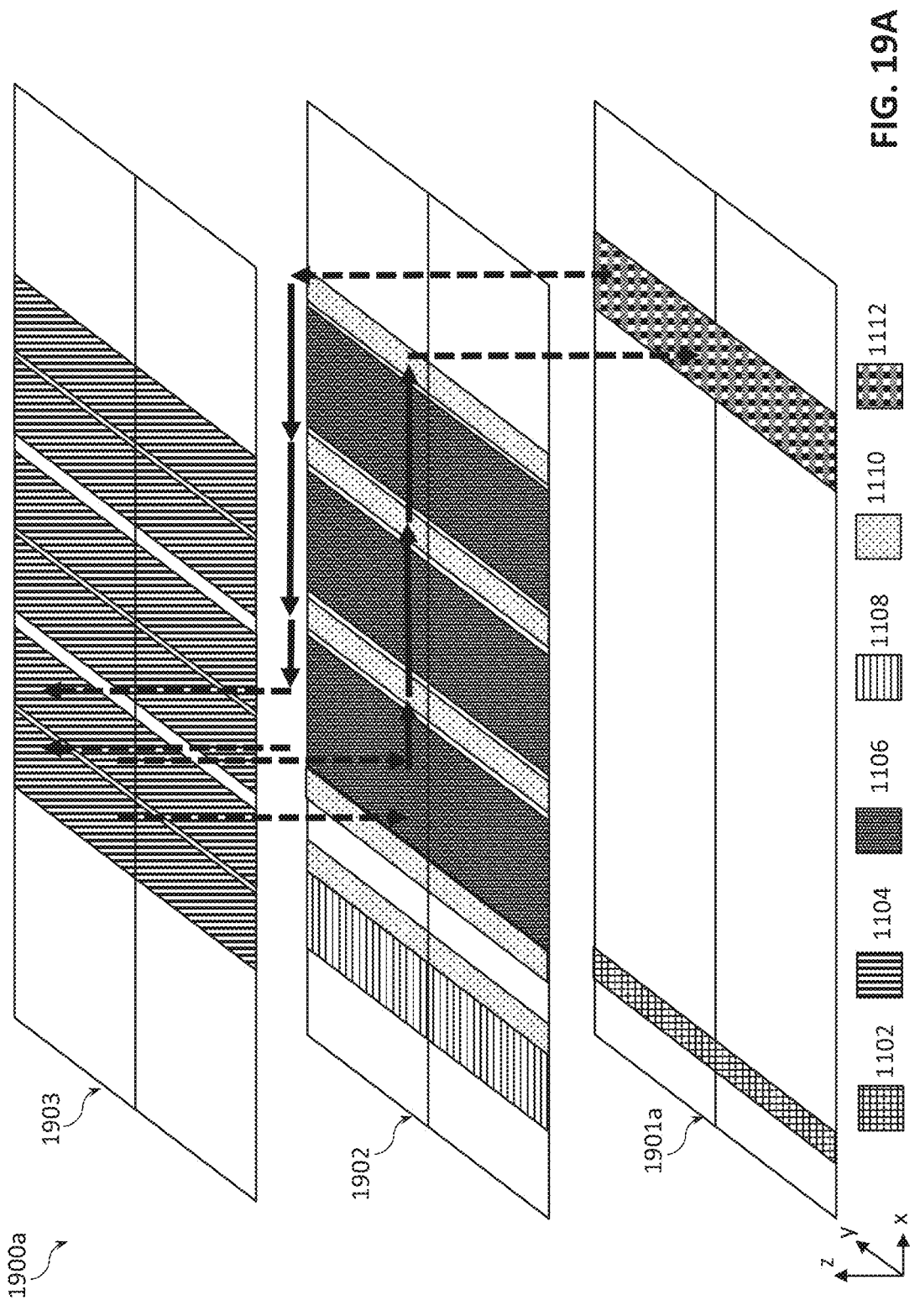
FIGS. 19A and 19B provides two example plan views of stacked memory devices having one portion of peripheral circuitry on a first layer, another portion of peripheral circuitry on a second layer, and memory arrays on a third layer, according to some embodiments of the present disclosure.
Figure 19B:
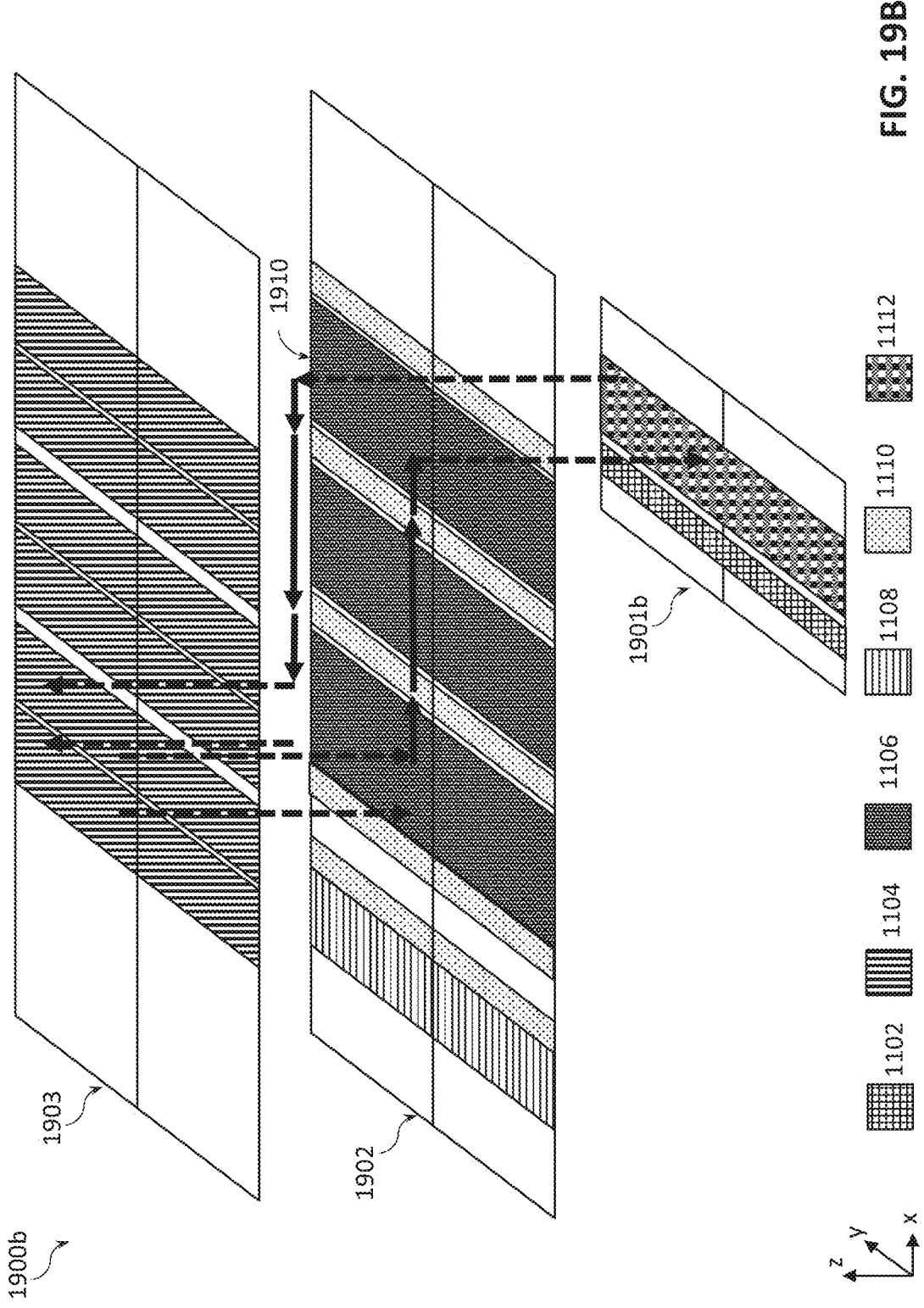

FIG. 7 illustrates four layers that make up a memory structure 790: a first peripheral device layer 740a, a first SRAM layer 750a, a second peripheral device layer 740b, and a second SRAM layer 750b. Additional peripheral device layers and/or SRAM layers may be included in the IC device 700, e.g., above the SRAM layer 750b. In some examples, peripheral devices are separated onto multiple peripheral device layers rather than the one peripheral device layer (per memory layer) shown in FIG. 7, e.g., as shown in FIGS. 19A and 19B.

Each of the SRAM layers 750 includes several SRAM arrays 755. In particular, the first SRAM layer 750a includes the SRAM arrays 755a, 755b, and 755c, and the second SRAM layer 750b includes the SRAM arrays 755d, 755e, and 755f. Each SRAM layer 750 may include more or fewer SRAM arrays 755 than shown in FIG. 7. Each SRAM array 755 includes a set of SRAM memory cells, such as the SRAM bitcells depicted in FIGS. 5 and 6. Each SRAM array 755 may further include some control circuitry, e.g., a row decoder, column input/output, and timing circuitry. An example layout for a memory array is shown in FIG. 10.

The peripheral device layers 740 include one or more sets of peripheral devices associated with the SRAM arrays 755, e.g., devices for accessing the SRAM arrays 755. In typical SRAM arrangements, peripheral devices are included in the same layer as the SRAM arrays 755, e.g., in the SRAM layer 750. In various embodiments described herein, different groups of peripheral circuits are included instead in a separate peripheral device layer 740. Example arrangements of memory arrays (e.g., the SRAM arrays 755) and peripheral devices are shown in FIGS. 12-19.

Moving peripheral devices to the peripheral device layer 740 can improve processing of the SRAM arrays 755 and/or the peripheral device layers 740. For example, if peripheral devices that are fabricated using a different processing technology from the SRAM arrays 755 are moved to the peripheral device layer 740, this simplifies the processing of the SRAM layer 750, and may result in fewer defects in the SRAM arrays 755. Furthermore, moving the peripheral devices to a peripheral device layer 740 frees up space in the SRAM layer 750 to provide additional and/or larger SRAM arrays 755 and thus increase memory capacity. In addition, having a separate layer for peripheral devices increases the surface area available for the peripheral devices themselves, so circuit designers may devote more area to peripheral devices. This can lead to improved memory access, e.g., by increasing bandwidth of signals to and from the SRAM arrays 755.

As noted above, a metal layer 730 is depicted between the logic layer 720 and the peripheral device layer 740a; the metal layer 730 (which may comprise multiple metal layers) is used to interconnect the various inputs and outputs of the logic layer 720 to inputs and outputs of the first peripheral device layer 740a. Additional metal layers may be included, e.g., above the first peripheral device layer 740a, below and/or above the second peripheral device layer 740b, and/or above the second SRAM layer 750b. These metal layers may be considered part of the layers above or below them. Furthermore, while not specifically shown in FIG. 7, solder bumps, such as the solder bumps 280 and/or 285 shown in FIG. 2, may be included in the IC device 700.

FIG. 7 depicts example vias 760 extending in the z-direction and forming connections between the metal layer 730 and the second SRAM layer 750b. In this example, a series of vias 760 are sequentially formed and connected at metal layers, e.g., the vias 760a and 760b are coupled at a metal interconnect 770a, which is part of a metal layer. For example, as the SRAM arrays 755 are processed in various layers, the vias 760 may be processed in layers, forming the via-interconnect-via-interconnect structure shown in FIG. 7. Some of the vias, such as via 760a, extend through the first peripheral device layer 740a, and some of the vias, such as via 760c, extend through the second peripheral device layer 740b. The metal layers connected to the vias 760 at various positions in the z-direction may be configured to transmit signals (e.g., power or data) to various layers, e.g., the SRAM layers 750a and 750b, and the peripheral device layers 740a and 740b.

While not specifically shown in FIG. 7, the SRAM layers 750 may also include interconnects and vias, which may have a similar arrangement to the vias 760 and metal interconnects 770. While the metal interconnects 770 are depicted as extending into and/or out of the page, i.e., in the x-direction in the reference coordinate system of FIG. 7, one or more metal interconnects within the SRAM arrays 755 and/or outside the SRAM arrays 755 may alternately extend in the y-direction. For example, two or more adjacent vias may be coupled together in the y-direction by a metal trench that spans the adjacent vias.

The SRAM layers 750 and SRAM arrays 755 depicted in FIG. 7 are merely exemplary, and as described above, in other embodiments, different types of memory may be used. For example, DRAM arrays (such as the DRAM arrays 245 shown in FIG. 2) may be included instead of the SRAM arrays 755 to create DRAM layers instead of SRAM layers.

Figure 8:
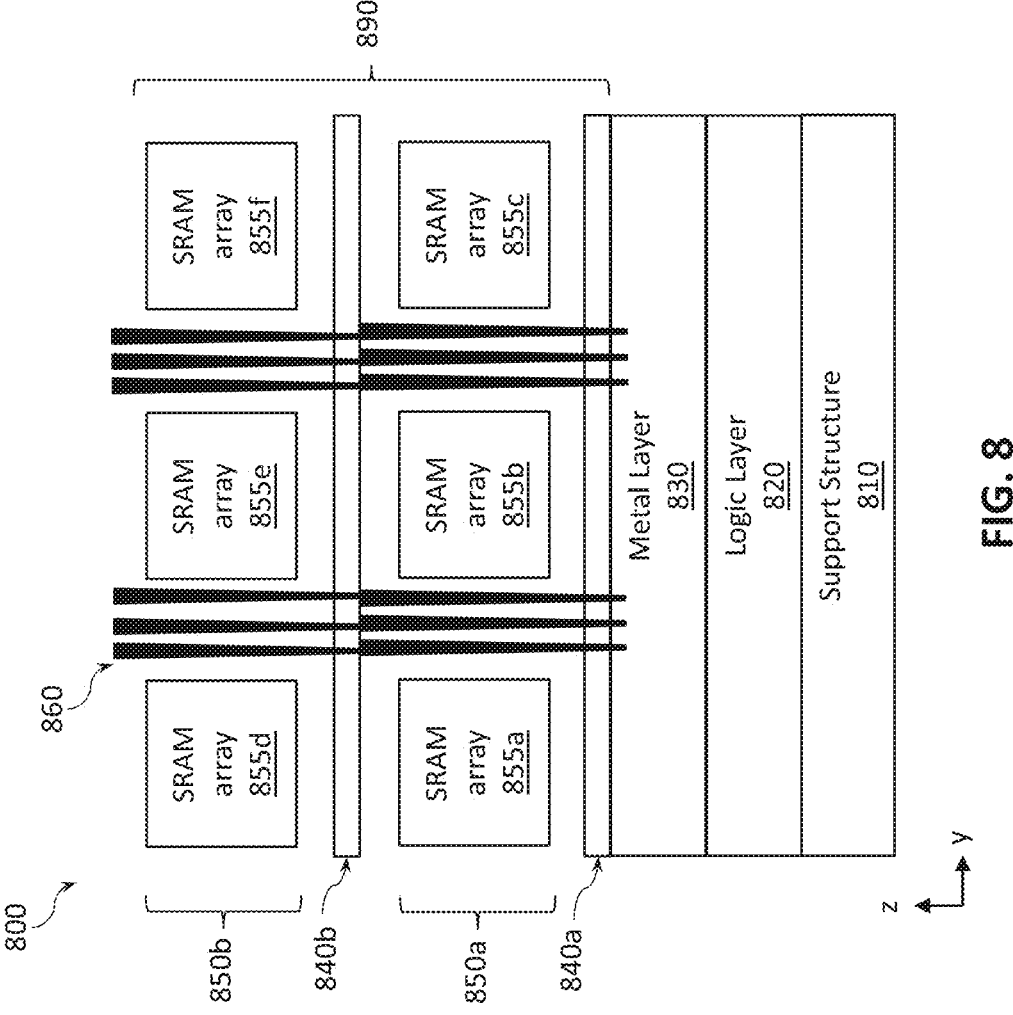
FIG. 8 provides an example cross-section of an IC device with SRAM layers stacked over respective peripheral device layers and with vias spanning the height of the SRAM layers, according to some embodiments of the present disclosure.

FIG. 8 provides an example cross-section of an IC device 800 with SRAM layers stacked over respective peripheral device layers and with vias spanning the height of the SRAM layers, according to some embodiments of the present disclosure. FIG. 8 includes a support structure 810, a logic layer 820, and a metal layer 830, which are similar to the corresponding layers shown in FIGS. 2 and 7. FIG. 8 further includes four layers that make up a memory structure 890: a first peripheral device layer 840a, a first SRAM layer 850a, a second peripheral device layer 840b, and a second SRAM layer 850b. Additional peripheral device layers and/or SRAM layers may be included in the IC device 800, e.g., above the SRAM layer 850b. The SRAM layers 850 each include several SRAM arrays 855. The peripheral device layers 840 and SRAM layers 850 are similar to the peripheral device layers 740 and SRAM layers 750 described above.

FIG. 8 depicts example vias 860 extending in the z-direction and forming connections between the metal layer 730 and the second SRAM layer 750b. In this example, a first set of vias extend from the metal layer 830, through the first peripheral device layer 840a, and through the first SRAM layer 850a. The first set of vias may be fabricated after the first SRAM layer 850a. A second set of vias is formed through the second peripheral device layer 840b and the second SRAM layer 850b. At least some of the second set of vias may be in contact with at least some of the first set of vias, as illustrated in FIG. 8. The vias 760 may connect to metal layers as described above to transmit signals (e.g., power or data) to various layers, e.g., the SRAM layers 750a and 750b, and the peripheral device layers 740a and 740b. Using long vias that extend through the SRAM layers 850, as shown in FIG. 8, can improve signal transmission through the vias compared to the via arrangement shown in FIG. 7. The metal interconnects 770 used to connect the vias in FIG. 7 can add resistance to the via stack, which can impair signal transmission across the via stack, particularly with a multi-layered stacked memory structure with long via pathways and potentially many metal interconnects.

Figure 9:
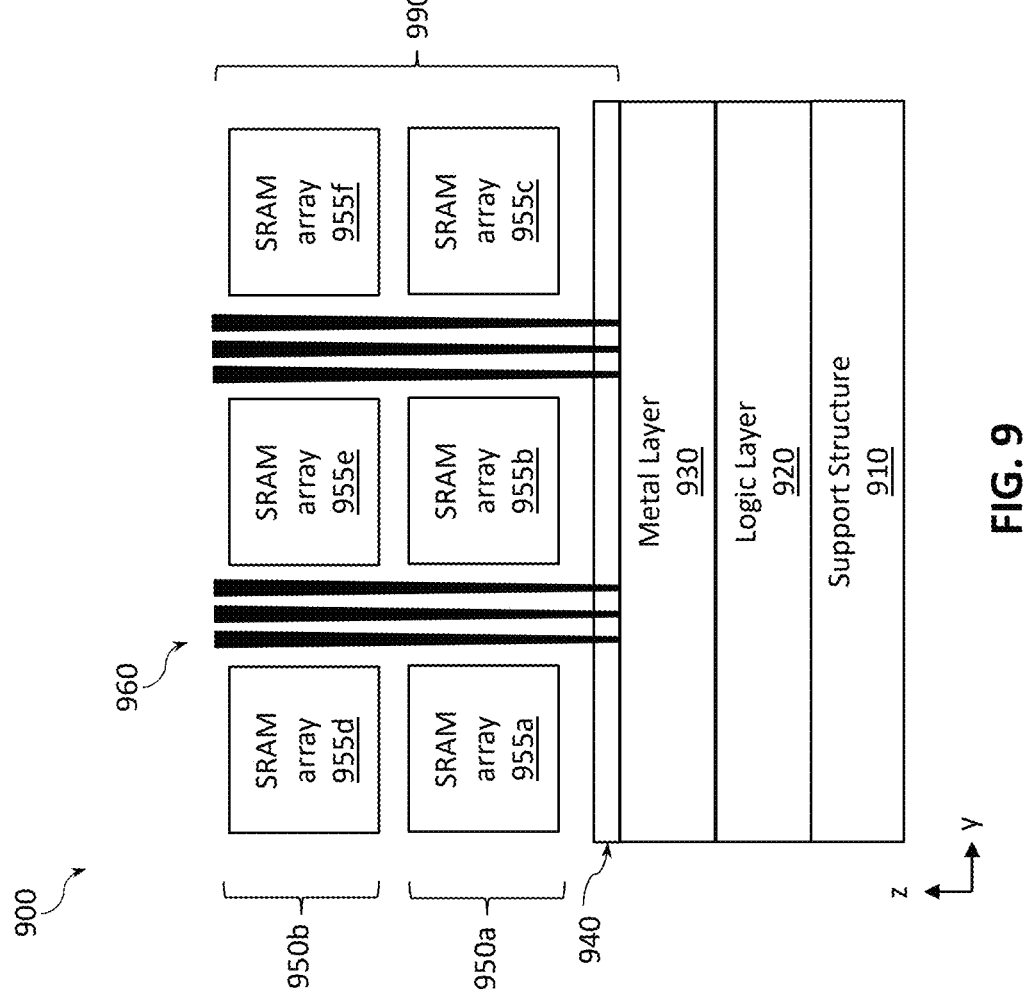
FIG. 9 provides an example cross-section of an IC device with multiple SRAM layers stacked over a peripheral device layer and with vias spanning the height of multiple SRAM layers, according to some embodiments of the present disclosure.

FIG. 9 provides an example cross-section of an IC device 900 with multiple SRAM layers stacked over a peripheral device layer and with vias spanning the height of multiple SRAM layers, according to some embodiments of the present disclosure. FIG. 9 includes a support structure 910, a logic layer 920, and a metal layer 930, which are similar to the corresponding layers shown in FIGS. 2, 7, and 8. FIG. 9 further includes three layers that make up a memory structure 990: a peripheral device layer 940, a first SRAM layer 950a, and a second SRAM layer 950b. In this example, the peripheral device layer 940 is used to access and control memory arrays on multiple memory layers 950a and 950b. Additional peripheral device layers and/or SRAM layers may be included in the IC device 900, e.g., a third SRAM layer may be included above the SRAM layer 950b. The SRAM layers 950 each include several SRAM arrays 955. The peripheral device layers 940 and SRAM layers 950 are similar to the peripheral device layers 740 and SRAM layers 750 described above, except that a single peripheral device layer 940 can communicate with, access, and control multiple SRAM layers 950. As noted with respect to FIG. 7, in some embodiments, rather than having one peripheral device layer 940, peripheral devices are distributed onto multiple peripheral device layers, e.g., as shown in FIGS. 19A and 19B.

FIG. 9 depicts example vias 960 extending in the z-direction and forming connections between the metal layer 930 and the second SRAM layer 950b. In this example, at least some vias (including the vias 960 depicted in FIG. 9) extend through the peripheral device layer 840 and both of the SRAM layers 950a and 950b. The vias 960 may connect to metal layers as described above to transmit signals (e.g., power or data) to various layers, e.g., between the peripheral device layer 940 and the SRAM layers 950a and 950b.

Using long vias that extend through the SRAM layers 950, as shown in FIG. 9, can improve signal transmission through the vias compared to the via arrangement shown in FIG. 7. The metal interconnects 770 used to connect the vias in FIG. 7 can add resistance to the via stack, which can impair signal transmission across the via stack, particularly with a multi-layered stacked memory structure with long via pathways and potentially many metal interconnects.

Example Arrangement of a Memory Array

FIG. 10 provides a plan view of a memory array 1000, according to some embodiments of the present disclosure. The memory array 1000 may be, for example, the DRAM array 245 of FIG. 2, the SRAM array 755 of FIG. 7, the SRAM array 855 of FIG. 8, or the SRAM array 955 of FIG. 9. The memory array includes four blocks of memory cells 1010a, 1010b, 1010c, and 1010d; two row decoders 1020a and 1020b; two column input and output (col I/O) blocks 1030a and 1030b; and a control block 1040.

The memory cells 1010 may be, for example, DRAM memory cells, such as the memory cells shown in FIGS. 3 and 4, or SRAM memory cells, such as the memory cells shown in FIGS. 5 and 6. The memory cells 1010 are arranged in rows and columns, where a row of memory cells are coupled to a common WL, and a column of memory cells are connected to a common BL. In some embodiments, each column of memory cells is connected to two BLs: a first BL and a second BL that is the inverse of the first BL.

The row decoders 1020 receive a memory address for a read or write operation, e.g., from mid-logic (described below with respect to FIG. 11). The row decoders 1020 decode the memory address and determine whether the memory address corresponds to a memory cell (or set of memory cells) accessible via the row decoder 1020. Each row decoder 1020 is associated with and coupled to a subset of the memory cells 1010. In FIG. 10, the row decoder 1020a is coupled to the two blocks of memory cells, 1010a and 1010c, that are adjacent to the row decoder 1020a. Likewise, the row decoder 1020b is coupled to the two blocks of memory cells, 1010b and 1010d, that are adjacent to the row decoder 1020b. If the memory array 1000 receives a read or write request for a particular set of memory cells, the row decoder 1020a determines whether the address in the request corresponds to memory cells in either block 1010a or 1010c, and the row decoder 1020b determines whether the address in the request corresponds to memory cells in either block 1010b or 1010d. If a row decoder 1020 determines that an address corresponds to memory cells in its associated blocks, the row decoder 1020 selects the WL for the addressed memory cells. The row decoder 1020 may further include a row driver for each WL to drive a signal down the WL; the row driver may include one or more inverters to drive the WL.

The col I/O blocks 1030 read out data from selected columns (BLs, or pairs of BLs if inverse BLs are included) of the memory cells 1010. In FIG. 10, the col I/O block 1030a is coupled to and reads data from the two blocks of memory cells, 1010a and 1010b, that are adjacent to the col I/O block 1030a. Likewise, the col I/O block 1030b is coupled to and reads data from the two blocks of memory cells, 1010c and 1010d, that are adjacent to the col I/O block 1030b. As noted above, the memory cells 1010 are arranged in rows and columns. In a read operation, for example, a WL is driven by a row decoder 1020, e.g., the row decoder 1020a drives a selected WL in the block of memory cells 1010a. The selected WL is coupled to many memory cells, and the read request may request data from a subset of these memory cells, as indicated by an address range in the read request. The col I/O (e.g., the col I/O 1030a) may include a column multiplexer that selects a subset of the columns to read, and read/write circuitry that reads (in a read operation) data from the selected subset of columns. In a write operation, the col I/O block 1030 writes data to a set of memory cells indicated by the address and selected by the column multiplexers.

The control block 1040 includes schedules and timers to synchronize operations across the memory array 1000. The control block 1040 may also include buffers and/or other control circuitry known in SRAM and/or DRAM technologies.

Example Arrangement of a Single-Layer Memory

Figure 11A:
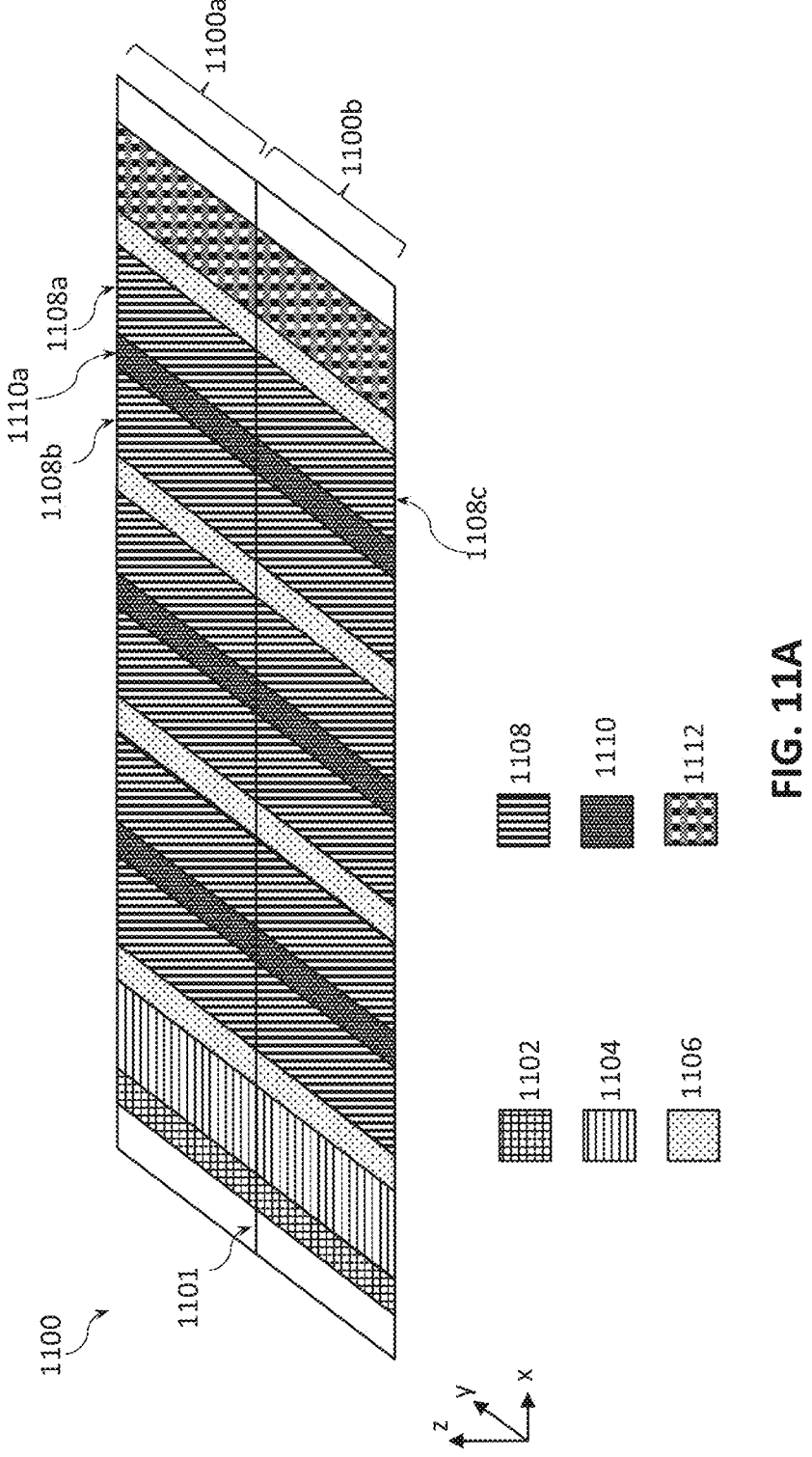
FIG. 11A provides a plan view of a memory device including memory arrays and peripheral circuitry, according to some embodiments of the present disclosure.

FIG. 11A provides a plan view of a single-layer memory device 1100 that includes memory arrays and peripheral circuitry, according to some embodiments of the present disclosure. Different regions of the memory device 1100 are indicated by different patterns, with a legend showing the correspondence between the reference numerals and patterns being provided at the bottom of the drawing page. The same set of patterns is used throughout FIGS. 11A-19 to refer to different blocks or regions. The legend illustrates that the different patterns show a self-test block 1102, a voltage block 1104, repeaters 1106, memory arrays 1108, mid-logic 1110, and input and output (I/O) circuitry 1112. Although a certain number of a given element may be illustrated in FIGS. 11A-19 (e.g., twelve memory arrays and eight repeaters in FIG. 11A), this is simply for ease of illustration, and more, or less, than that number may be included in a memory structure according to various embodiments of the present disclosure. Furthermore, FIG. 11A shows one possible arrangement of the different regions. In other embodiments, the regions may be arranged differently than shown in FIG. 11A.

A center line 1101 is depicted running through the memory device 1100 traveling in the x-direction. The center line 1101 divides the memory device 1100 into two portions 1100a and 1100b, each portion encompassing a different portion of the memory device 1100 in the y-direction. The circuitry regions or blocks on either side of the line 1101 may be considered separate regions. For example, the center line 1101 separates the memory array 1108a in the first portion 1100a from the memory array 1108c in the second portion 1100b. These memory arrays 1108a and 1108c may operate independently. Various regions which may be broken into separate portions are discussed jointly below (e.g., a single self-test block 1102 is discussed). However, it should be understood that the memory device 1100 may include any number of each circuitry region or block. In some embodiments, the memory device 1100 is not separated into two portions 1100a and 1100b; in other embodiments, the memory device 1100 is separated into three or more portions in the y-direction.

The self-test block 1102 includes circuitry used during manufacture of the memory device 1100 to test functionality of the memory device 1100 prior to the memory device 1100 being shipped or incorporated into a larger system. The self-test block 1102 is typically present on a memory device but not used during normal operation. In the example shown in FIG. 11, one self-test block 1102 is shown, but in other embodiments, there may no self-test block 1102 or multiple self-test blocks 1102.

The voltage block 1104 includes circuitry for maintaining voltage levels within the memory device 1100. The voltage block 1104 may include one or more capacitors to store charge. During operation, the memory device 1100 receives power from an external power source. However, in certain cases, operations of the memory device 1100 may draw more current than can be provided by the external power source. For example, a large amount of data being accessed at once or in quick succession may consume more current than the external power source can provide, or the external power source may have a delay in delivering a greater current. If the current draw exceeds the power supply or if the power supply is delayed, the voltage block 1104 can provide a temporary current surge, e.g., by drawing down charge from a capacitor in the voltage block 1104. The voltage block 1104 also includes switching circuitry for controlling charging and discharging of the capacitor(s). For example, the switching circuitry recharges the capacitor, e.g., when the power draw for memory operations are reduced. In the example shown in FIG. 11, one voltage block 1104 is shown, but in other embodiments, there may no voltage blocks 1104, or multiple voltage blocks 1104 (e.g., at different locations across the memory device 1100) may be included.

The repeaters 1106 include circuitry for maintaining a signal as it traverses the memory device 1100. The repeaters 1106 may include buffers, e.g., a series of inverting buffers, that receive a signal and pass the signal onto another part of the memory device 1100. The repeaters 1106 break up wires crossing the length (in the x-direction) of the memory device 1100, which improves signal transmission across the memory device 1100 and may reduce delay across the memory device 1100.

The memory arrays 1108 include blocks of memory cells and control circuitry for the particular blocks of memory cells. The memory arrays 1108 may be arranged as shown in FIG. 10, with four blocks of memory cells 1010, two row decoders 1020, two col I/O blocks 1030, and a control block 1040. In other embodiments, other arrangements may be used. The memory arrays 1108 may be, for example, DRAM arrays, as further described with respect to FIGS. 2-4, or SRAM arrays, as further described with respect to FIGS. 5-9. In other embodiments, other types of memory cells may be used.

The mid-logic 1110 receives a memory address for a read or write operation, e.g., from the I/O circuitry 1112. The mid-logic 1110 includes circuitry for decoding the memory address and determining whether the memory address corresponds to a memory array associated with and coupled to the mid-logic 1110. For example, the mid-logic 1110a labelled in FIG. 11A determines whether a memory address is present in either array 1108a or 1108b, which are adjacent to the mid-logic 1110a. If the mid-logic 1110 determines that a memory address is present in an associated memory array, the mid-logic 1110 passes the memory address to the row decoders 1020, described with respect to FIG. 10. In a memory device 1100 with many memory arrays 1108, the number of memory addresses may be more than the row decoders 1020 can keep track of. The mid-logic 1110 ensures that only relevant addresses are sent to the row decoders 1020, which may result in greater efficiency and less surface area devoted to the row decoders 1020. The mid-logic 1110 may also include a timing circuit that schedules memory requests and acts as an intermediary between off-device communications (e.g., the I/O circuitry 1112) and on-device data transfer.

The I/O circuitry 1112 interacts with external devices, e.g., the CPU 205 and GPU 210 shown in FIG. 2, or other devices coupled to the memory device 1100. The I/O circuitry 1112 receives read and/or write requests an external device and transmits the requests to other circuitry (e.g., the mid-logic 1110) in the memory device 1100. The I/O circuitry 1112 further transmits signals (e.g., data retrieved responsive to a read request) to the external device. In some embodiments, the I/O circuitry 1112 includes additional circuitry, such as timing circuitry and encryption and/or decryption circuitry (e.g., to encrypt data prior to passing it to an external device).

FIG. 11A illustrates a device layer of the memory device 1100. The memory device 1100 may further include one or more additional layers, including metal layers, not shown in FIG. 11A. The metal layers provide communication between different regions of the memory device 1100. In particular, at least some of the regions shown in FIG. 11A are connected by vias to a metal layer that includes trenches that span across one or more of the regions shown in FIG. 11A. This enables communication between different regions of FIG. 11A. The metal layer(s) may further enable power delivery to different regions of FIG. 11A, e.g., from a power supply in the I/O circuitry 1112 and/or from the voltage block 1104, described above.

Figure 11B:
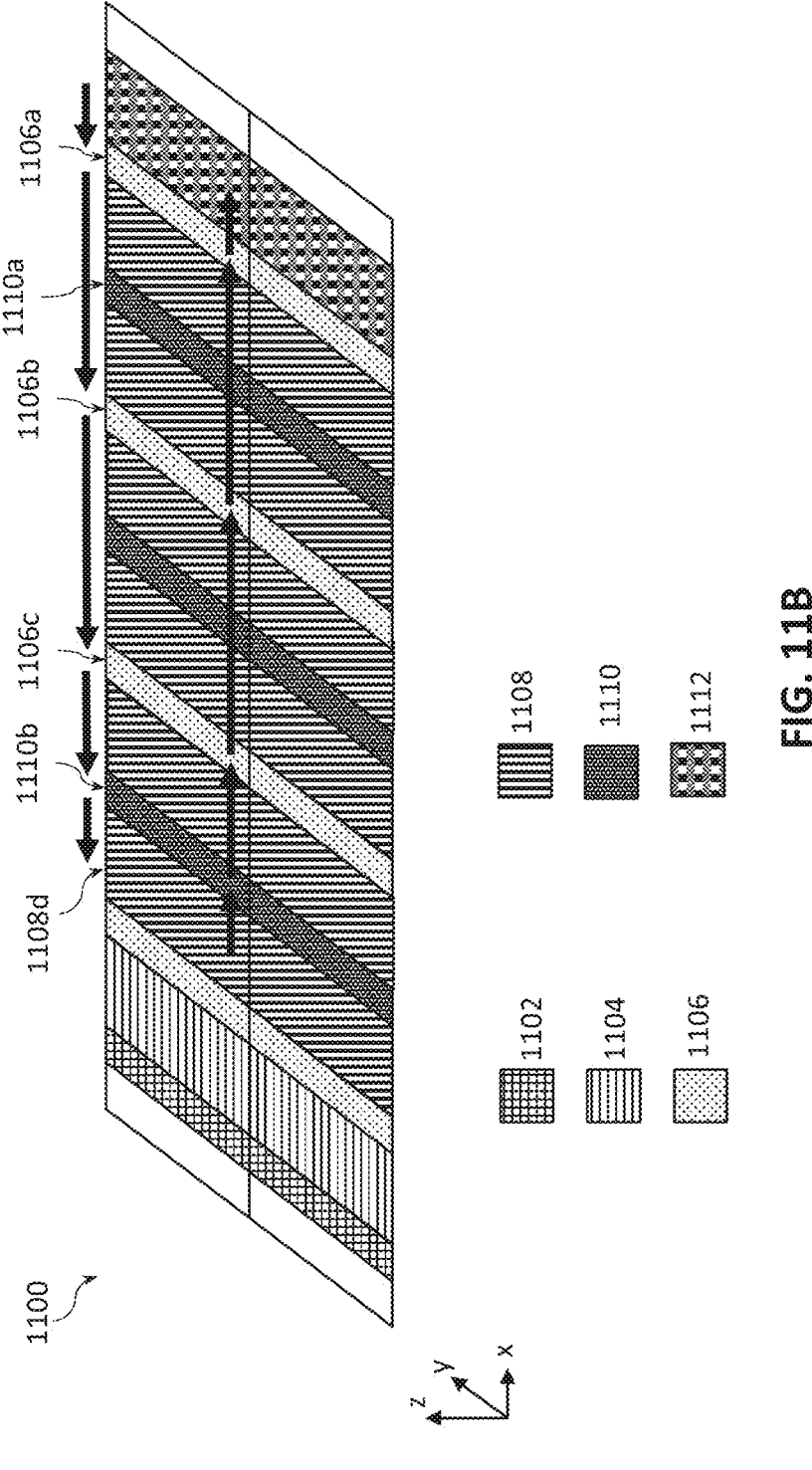
FIG. 11B illustrates a data pathway across the memory device of FIG. 11A, according to some embodiments of the present disclosure.

FIG. 11B illustrates a data pathway across the memory device of FIG. 11A, according to some embodiments of the present disclosure. In this example, the I/O circuitry 1112 receives a request (e.g., a read request) from an external device. The I/O circuitry 1112 transmits the read request, including a specific memory address or address range (generally referred to as an address range), across the memory device 1100 and to the various mid-logic 1110 regions, e.g., region 1110a and 1110b. In this example, the repeaters 1106 are used to transmit the read request across the memory device 1100, as illustrated by the arrows moving from the I/O circuitry 1112 and across the top of FIG. 11B. More specifically, the read request moves from the I/O circuitry 1112 to the repeater 1106a, to the repeater 1106b, and the repeater 1106c. Mid-logic regions 1110 receive the read request from one of the repeaters 1106. For example, the mid-logic 1110a may receive the read request from the repeater 1106a. The mid-logic 1110a may discard the read request if the address range does not match its associated memory arrays (here, memory arrays 1108a and 1108b labelled in FIG. 11A).

In this example, the address range in the read request corresponds to the memory array 1108d. The mid-logic 1110b receives the read request from the repeater 1106c and determines that the address range in the read request is within the memory array 1108d. The mid-logic 1110b transmits the read request to the memory array 1108d, and the memory array 1108d outputs the data stored at the requested memory range. The output data travels back to the I/O circuitry 1112 in a similar manner (e.g., through the mid-logic 1110b, repeaters 1106c, 1106b, and 1106a, and to the I/O circuitry 1112), as illustrated by the right-pointing arrows in FIG. 11B.

Example Arrangements of a Stacked Memory

FIGS. 12-19 provide plan views of several example stacked memory devices that include some peripheral circuitry in a first layer and memory arrays in a second layer. Each of the memory devices shown in FIGS. 12-19 include the same device regions 1102-1112 shown in FIG. 11, and the same set of patterns are used, as shown in the legends on each drawing page. The characteristics of the device regions 1102-1112 shown in FIGS. 12-19 are similar to the corresponding regions shown in FIG. 11, and descriptions of the device regions 1102-1112 are not repeated here.

Each of the stacked memory devices shown in FIG. 12-18 includes two layers: a peripheral device layer that includes peripheral devices, and a memory layer that includes one or more memory arrays. FIG. 19 further includes a second peripheral layer. The memory layer may, in some cases, also include some peripheral circuitry, as described further below. While only one peripheral device layer (two in FIG. 19) and one memory layer are illustrated in FIGS. 12-18, it should be understood that multiple memory layers and/or multiple peripheral layers may be included in a memory structure, e.g., as illustrated in FIGS. 7-9. Furthermore, while the memory layers are shown being stacked over the peripheral layers in FIGS. 12-19, in other embodiments, the peripheral layers may be stacked over the memory layers, or a peripheral layer may be between two or more memory layers.

As with FIG. 11, FIGS. 12-19 illustrate device layers of various memory devices. The memory devices shown in FIGS. 12-19 may further include one or more additional layers, including metal layers, not depicted in the figures. The metal layers provide communication between different regions of the memory device, including between different layers, as described with respect to FIG. 11 as well as FIGS. 2 and 7-9.

While the stacked memories shown in FIG. 12-19 are referred to as "memory devices," it should be understood that assemblies may not be standalone devices. In some embodiments, the memory assemblies shown in FIGS. 12-19 may be embedded memories incorporated into a larger device, e.g., the memory structure 190.

Figure 12:
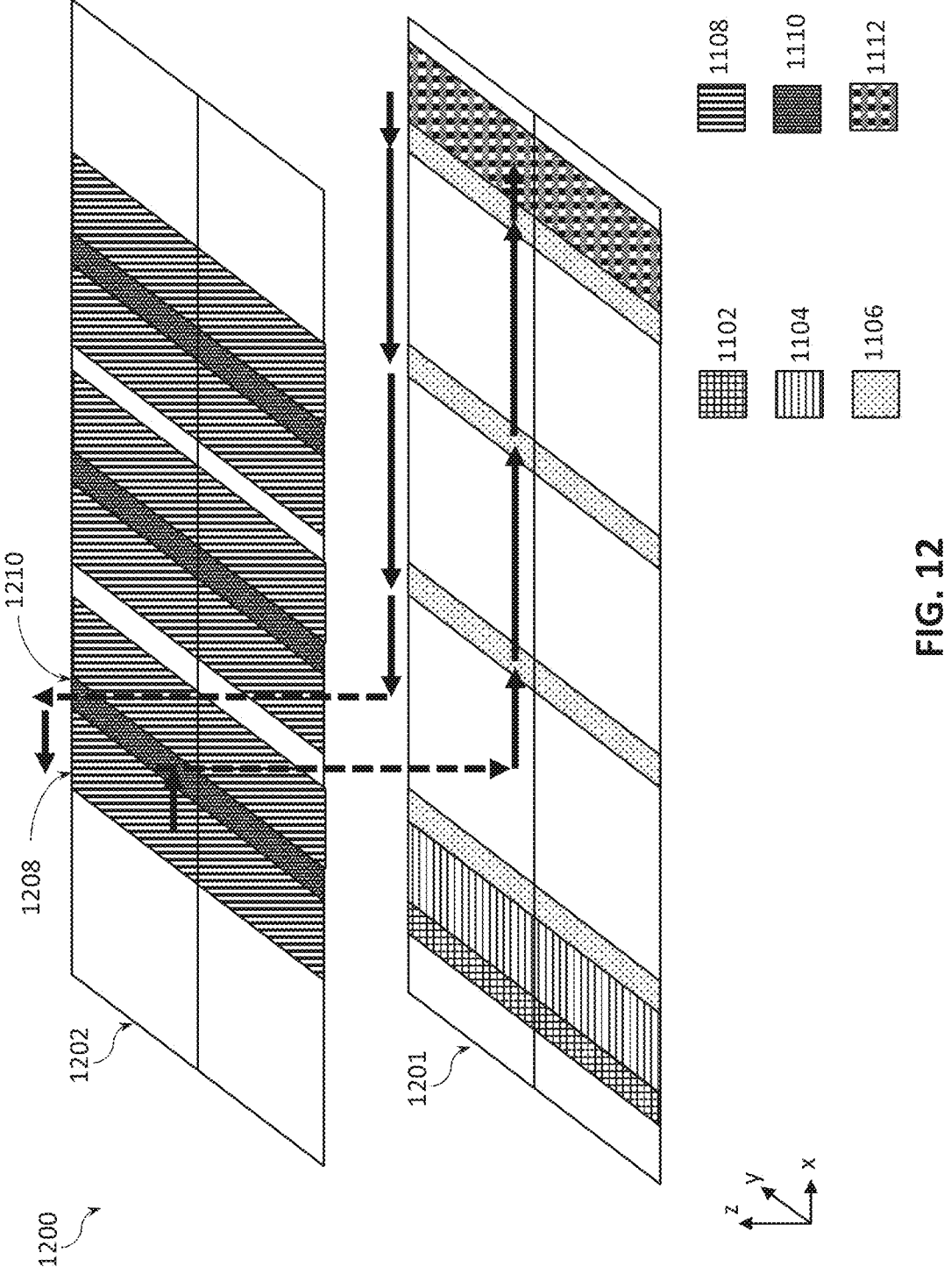
FIG. 12 provides a plan view of a first example stacked memory device having peripheral circuitry on a first layer and memory arrays on a second layer, according to some embodiments of the present disclosure.

FIG. 12 provides a plan view of a first example stacked memory device 1200 having peripheral circuitry on a first layer and memory arrays on a second layer, according to some embodiments of the present disclosure. In this example, the memory device 1200 includes two stacked layers 1201 and 1202. The first layer 1201 includes several peripheral device regions—the self-test block 1102, the voltage block 1104, the repeaters 1106, and the I/O circuitry 1112. The second layer 1202 includes the memory arrays 1108 and the mid-logic 1110.

The first layer 1201 is an example of a peripheral device layer, e.g., any of the layers 230, 740, 840, or 940 described above. The second layer 1202 is an example of a memory layer, e.g., the DRAM layer 240, or any of the SRAM layers 750, 850, or 950. While the second layer 1202 with the memory arrays 1108 and mid-logic 1110 is shown as being stacked over the first layer 1201 with the other peripheral circuitry, in other embodiments, the second layer 1202 is below the first layer 1201.

In this example, the peripheral devices in the first layer 1201 are moved to a different layer from the single-layer memory device 1100 shown in FIG. 11. The geometry (e.g., sizes and positions) of the various regions are not changed from the example shown in FIG. 11. In some embodiments, the white regions in the first layer 1201 (e.g., the regions below the memory arrays 1108 and mid-logic 1110) and/or the white regions in the second layer 1202 (e.g., the regions above the repeaters 1106) may include decoupling capacitors to maintain voltage levels within the memory device 1200. In some embodiments, other additional circuitry is included in the white regions, e.g., additional memory arrays are included in the white regions of the first layer 1201 below the memory arrays 1108 of the second layer 1202.

FIG. 12 also illustrates a data pathway through the memory device 1200. In this example, the I/O circuitry 1112 receives a request (e.g., a read request) from an external device. The I/O circuitry 1112 transmits the read request, including a specific memory address or address range (generally referred to as an address range), across the memory device 1200 and to the various mid-logic regions 1110. In this example, the repeaters 1106 in the first layer 1201 transmit the read request across the first layer 1201 of the memory device 1200, as illustrated by the arrows moving from the I/O circuitry 1112 and across the top of the first layer 1201. The read request travels between layers (e.g., through a stack of vias 760 or one of the vias 260, 860, or 960) to mid-logic regions in the second layer 1202, e.g., to the mid-logic 1210 as shown in FIG. 12. In this example, the address range in the read request corresponds to the memory array 1208. The mid-logic 1210 receives the read request and determines that the address range in the read request is within the memory array 1208. The mid-logic 1210 transmits the read request to the memory array 1208, and the memory array 1208 outputs the data stored at the requested memory range. The output data travels back to the I/O circuitry 1112 in a similar manner (e.g., through the mid-logic 1210, down to the first layer 1201, through several repeaters 1106, and to the I/O circuitry 1112), as illustrated in FIG. 12.

Figure 13:
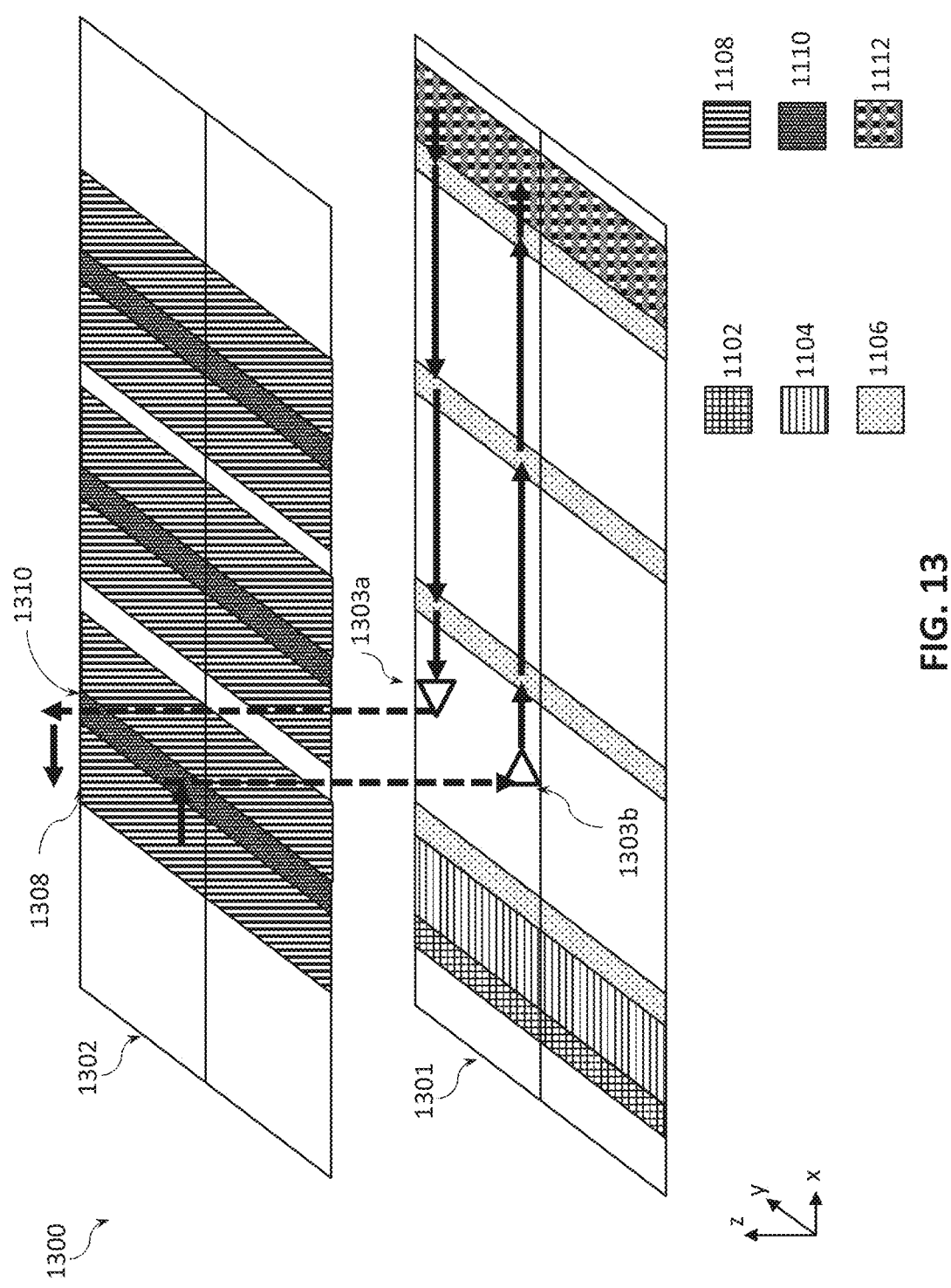
FIG. 13 provides a plan view of a second example stacked memory device having peripheral circuitry and buffers on a first layer and memory arrays on a second layer, according to some embodiments of the present disclosure.

FIG. 13 provides a plan view of a second example stacked memory device 1300 having peripheral circuitry and buffers on a first layer and memory arrays on a second layer, according to some embodiments of the present disclosure. FIG. 13 is similar to FIG. 12, and includes a first layer 1301 similar to the first layer 1201, and a second layer 1302 similar to the second layer 1202. Unlike the memory device 1200, the memory device 1300 includes buffers, e.g., buffers 1303a and 1303b, in the first layer 1301. The buffers 1303 are positioned between repeaters 1106 and below the mid-logic 1110 in the second layer 1302, e.g., buffers 1303a and 1303b are positioned below the mid-logic 1310. The buffers 1303 may speed up transmission of signals between the first layer 1301 and the second layer 1302, particularly when there is a relatively large distance (e.g., 1 micron or greater) between the first layer 1301 and the second layer 1302. In some embodiments, the buffers 1303, or additional buffers, may be positioned between the layers 1301 and 1302. The data pathway through the memory device 1300 is the same as the data pathway through the memory device 1200, with the signals passing through the buffers 1303, e.g., the read request passing from a repeater, through the buffer 1303a, to the mid-logic 1310, and to the memory array 1308, and the data traveling back through the buffer 1303b. In other embodiments, the read request and the read data may pass through the same buffer (e.g., 1303a).

Figure 14:
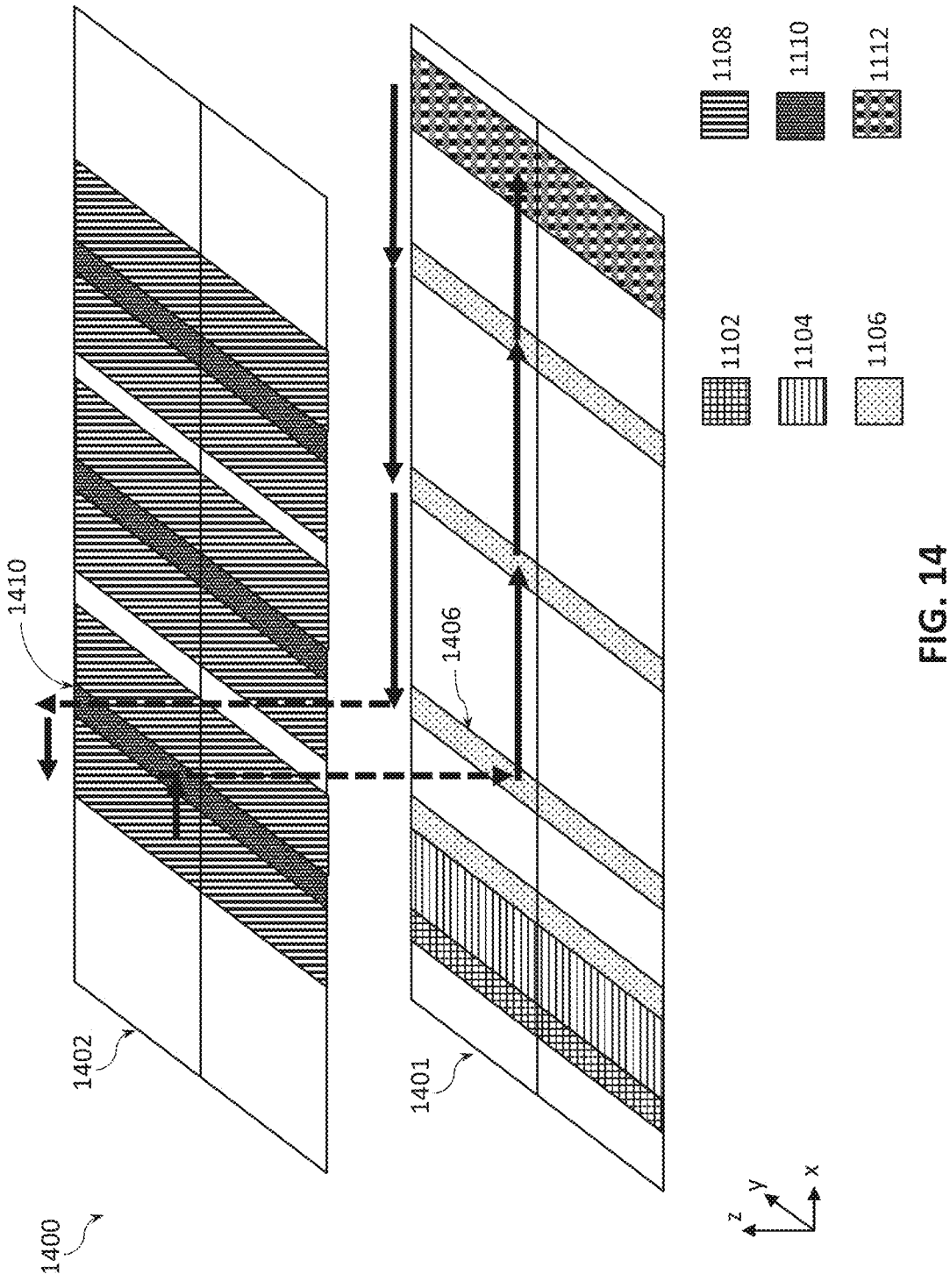
FIG. 14 provides a plan view of a third example stacked memory device having peripheral circuitry on a first layer and memory arrays on a second layer, with repeaters in the first layer aligned with mid-logic in the second layer, according to some embodiments of the present disclosure.

FIG. 14 provides a plan view of a third example stacked memory device 1400 having peripheral circuitry on a first layer and memory arrays on a second layer, with repeaters in the first layer aligned with mid-logic in the second layer, according to some embodiments of the present disclosure. FIG. 14 includes a first layer 1401 and a second layer 1402. The second layer 1402 is similar to the second layers 1202 and 1302 in FIGS. 12 and 13. The first layer 1401 includes the self-test block 1102, the voltage block 1104, repeaters 1106, and the I/O circuitry 1112. Unlike the memory devices 1200 and 1300, the repeaters 1106 are aligned with the mid-logic 1110. As used herein, two circuitry blocks on different layers are "aligned" if at least a portion of one block is positioned underneath or above at least a portion of another block, i.e., the blocks have at least some overlapping area in the x-direction and y-directions in the coordinate system shown in FIG. 14. In this example, at least a portion of each repeater 1106 is positioned underneath a corresponding portion of the mid-logic 1110. For example, the repeater 1406 in the first layer 1401 is aligned with the mid-logic 1410 in the second layer 1402. Positioning the repeaters 1106 so that they are aligned with the mid-logic 1110 can increase speed across the memory device 1400, and particular, can increase the speed of communications between the layers 1401 and 1402. In some embodiments, additional repeaters are added between the repeaters 1106 shown in FIG. 14 (i.e., between the repeaters that are aligned with the mid-logic 1110) to further increase speed across the first layer 1401.

Figure 15:
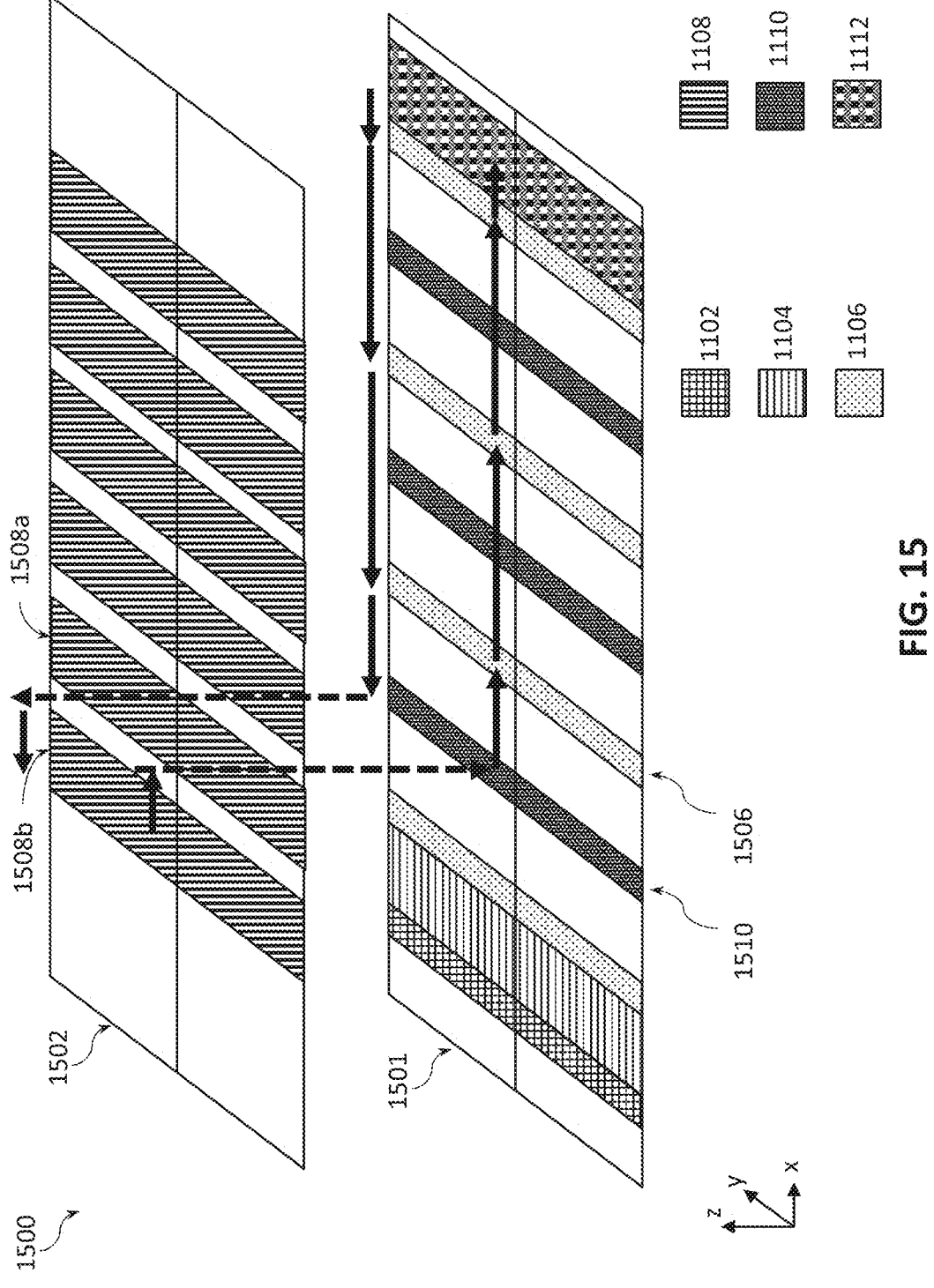
FIG. 15 provides a plan view of a fourth example stacked memory device having peripheral circuitry on a first layer and memory arrays on a second layer, with mid-logic included in the first layer, according to some embodiments of the present disclosure.

FIG. 15 provides a plan view of a fourth example stacked memory device having peripheral circuitry on a first layer and memory arrays on a second layer, with mid-logic included in the first layer, according to some embodiments of the present disclosure. In this example, the memory device 1500 includes two stacked layers 1501 and 1502. The first layer 1501 includes the self-test block 1102, the voltage block 1104, the repeaters 1106, the mid-logic 1110, and the I/O circuitry 1112. The second layer 1502 includes the memory arrays 1108.

The first layer 1501 is an example of a peripheral device layer, e.g., any of the layers 230, 740, 840, or 940 described above. The second layer 1502 is an example of a memory layer, e.g., the DRAM layer 240, or any of the SRAM layers 750, 850, or 950. While the second layer 1502 with the memory arrays 1108 is shown as being stacked over the first layer 1501 with the peripheral circuitry, in other embodiments, the second layer 1502 is below the first layer 1501.

In this example, the peripheral devices in the first layer 1501 are moved to a different layer from the single-layer memory device 1100 shown in FIG. 11. Comparing FIG. 15 to FIG. 12, the mid-logic 1110 is moved from the memory layer to the peripheral layer. In this example, the geometry (e.g., sizes and positions) of the various regions are not changed from the examples shown in FIGS. 11 and 12. As noted with respect to FIG. 12, in some embodiments, the white regions in the first layer 1501 (e.g., the regions below the memory arrays 1108) and/or the white regions in the second layer 1502 (e.g., the regions above the repeaters 1106 and the mid-logic 1110) may include decoupling capacitors to maintain voltage levels within the memory device 1500. In some embodiments, other additional circuitry is included in the white regions, e.g., additional memory arrays are included in the white regions of the first layer 1501 below the memory arrays 1108 of the second layer 1502.

FIG. 15 also illustrates a data pathway through the memory device 1500. In this example, the I/O circuitry 1112 receives a request (e.g., a read request) from an external device. The I/O circuitry 1112 transmits the read request, including a specific memory address or address range (generally referred to as an address range), across the memory device 1500 and to the various mid-logic regions 1110. In this example, the repeaters 1106 in the first layer 1501 transmit the read request across the first layer 1501 of the memory device 1500, as illustrated by the arrows moving from the I/O circuitry 1112 and across the top of the first layer 1501. The read request travels from the repeaters 1106 to the mid-logic 1110, e.g., from the repeater 1506 to the mid-logic 1510. The mid-logic 1510 receives the read request and determines that the address range in the read request is within one of the memory arrays corresponding to the mid-logic 1510, e.g., one of the memory arrays 1508a and 1508b (in this case, 1508b). The mid-logic 1510 transmits the read request between the layers 1501 and 1502 (e.g., through a stack of vias 760 or one of the vias 260, 860, or

960) to the memory array 1508b, and the memory array 1508b outputs the data stored at the requested memory range. The output data travels back to the I/O circuitry 1112 in a similar manner (e.g., down to the mid-logic 1510 in first layer 1501, through several repeaters 1106, and to the I/O circuitry 1112), as illustrated in FIG. 15.

By placing the mid-logic 1110 in the first layer 1501 with the peripheral devices rather than the second layer 1502 with the memory arrays 1108, more surface area can be used for mid-logic 1110 compared to arrangements in which the mid-logic 1110 is in the same layer as the memory arrays 1108 (e.g., the arrangement shown in FIG. 11). For example, in a single-layer memory arrangement, the mid-logic may use 1% or less of the surface area. However, particularly for larger memory devices with more and/or larger memory arrays, additional surface area is needed to perform the decoding. By moving the mid-logic to a peripheral device layer, a circuit designer can increase the size of the mid-logic 1110 to provide better functionality.

Figure 16A:
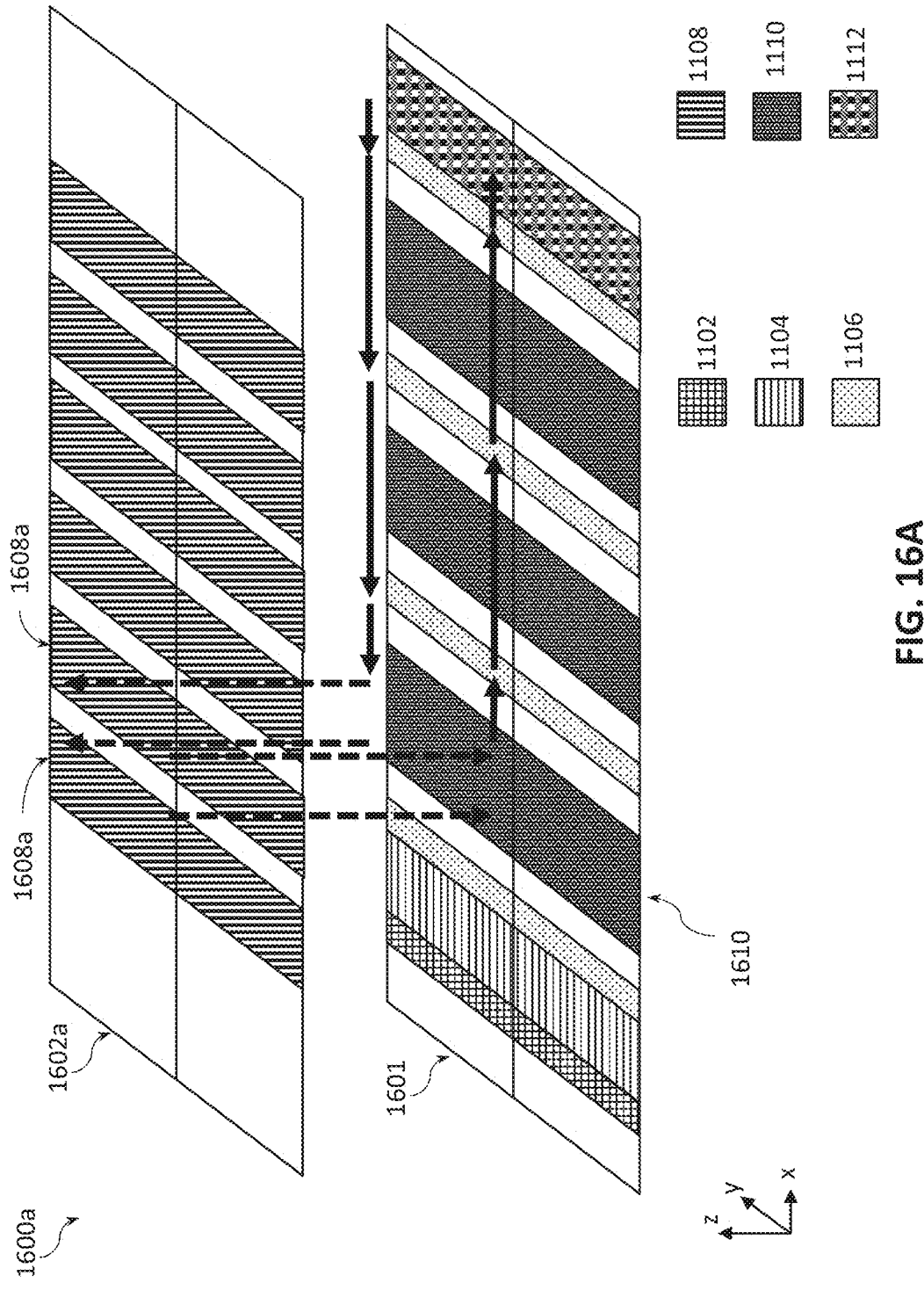
FIGS. 16A and 16B provide two example plan views of stacked memory devices having peripheral circuitry on a first layer and memory arrays on a second layer, with larger mid-logic sections included in the first layer and aligned with the memory devices in the second layer, according to some embodiments of the present disclosure.
Figure 16B:
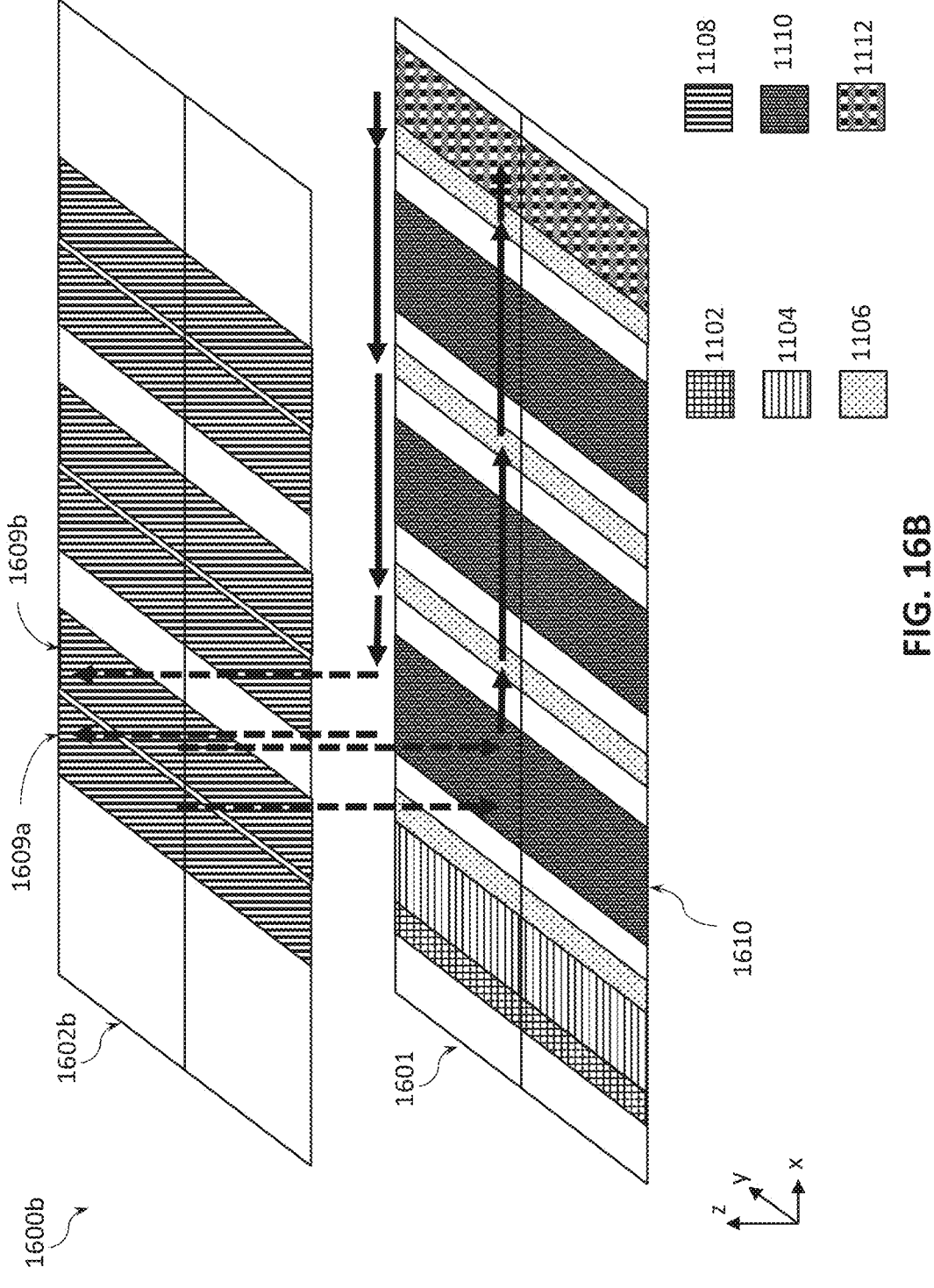

FIGS. 16A and 16B provide two example plan views of stacked memory devices 1600a and 1600b having peripheral circuitry on a first layer and memory arrays on a second layer, with larger mid-logic sections included in the first layer and aligned with the memory arrays in the second layer, according to some embodiments of the present disclosure. FIG. 16A includes a first layer 1601 and a second layer 1602a. The second layer 1602a is similar to the second layer 1502 of FIG. 15. The first layer 1601 includes the self-test block 1102, the voltage block 1104, repeaters 1106, mid-logic 1110, and the I/O circuitry 1112. The mid-logic 1110 shown in FIG. 16A is wider in the x-direction and consumes more surface area than the mid-logic 1110 shown in FIG. 15. Furthermore, in FIG. 16, at least a portion of the mid-logic 1110 is underneath at least a portion of the memory arrays 1108 corresponding to the mid-logic. For example, mid-logic 1610 is partially underneath the memory arrays 1608a and 1608b, as indicated by the data pathways shown in FIG. 16. Positioning the mid-logic 1610 so that it is aligned with the corresponding memory arrays 1108 can increase speed across the memory device 1600, and particular, can also increase the speed of communications between the layers 1601 and 1602a.

FIG. 16B illustrates an alternate stacked memory device 1600b with the larger mid-logic sections shown in FIG. 16A and with the memory arrays 1108 further aligned with the mid-logic 1110. FIG. 16B includes the same first layer 1601 shown in FIG. 16A, and a second layer 1602b. The second layer 1602b has the memory arrays 1108 shown in FIG. 16, but compared to FIG. 16A, the spacing between adjacent memory arrays 1108 that correspond to the same mid-logic 1110 is reduced. For example, the gap between the memory arrays 1609a and 1609b is reduced or removed compared to the memory arrays 1608a and 1608b in FIG. 16A. This further aligns the memory arrays 1609a and 1609b over their corresponding mid-logic 1610. Positioning the memory arrays 1609a and 1609b so that they are further aligned with the corresponding mid-logic 1610 can increase speed across the memory device 1600b, and particular, can further increase the speed of communications between the layers 1601 and 1602b, compared to the memory device 1600a. Furthermore, in some embodiments, each of the memory arrays 1108 may be made larger, or more memory arrays 1108 may be added in the second layer 1602b, to increase the capacity of the memory device.

Figure 17:
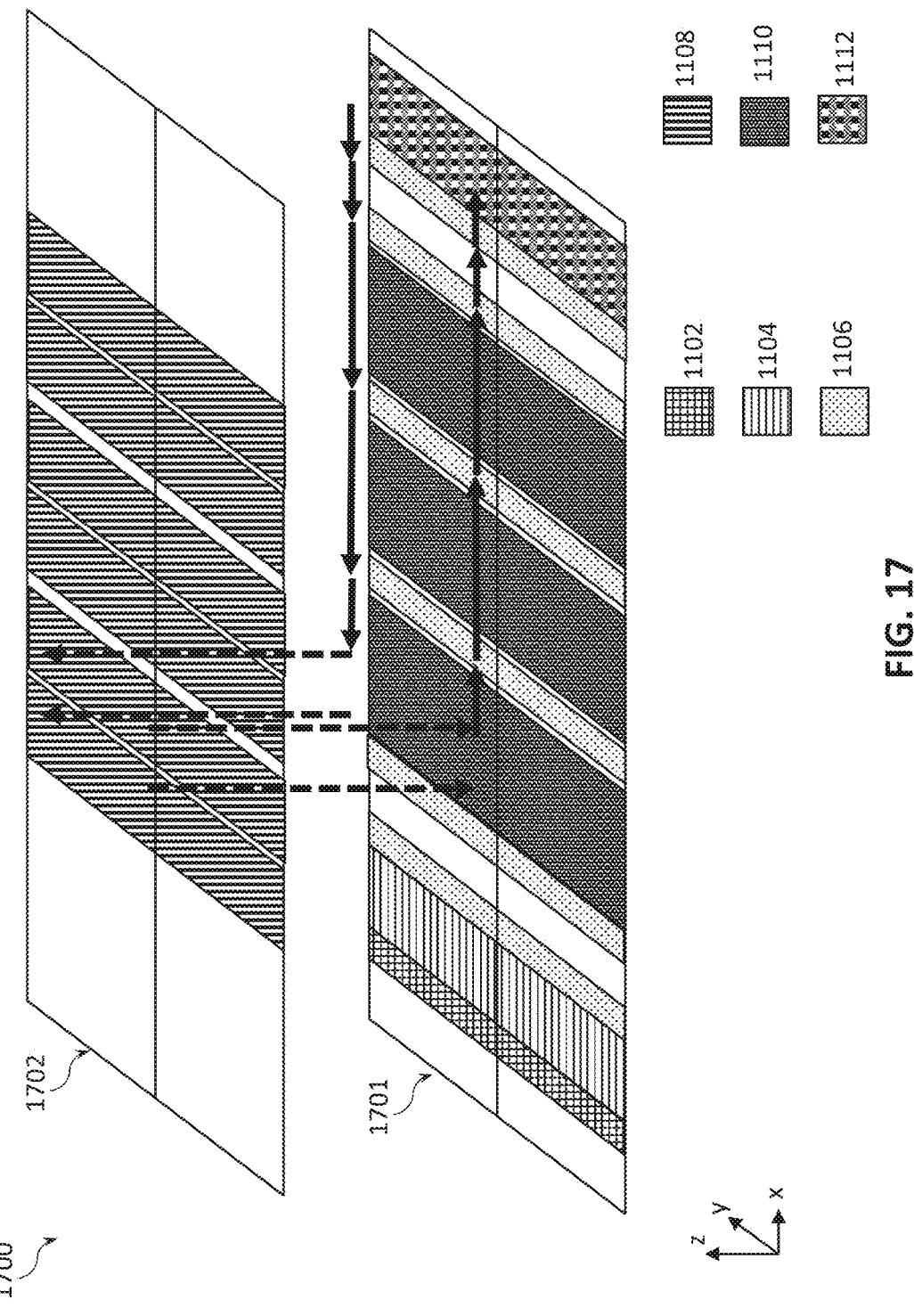
FIG. 17 provides a plan view of an example stacked memory device having peripheral circuitry on a first layer and memory arrays on a second layer, with increased memory density in the second layer, according to some embodiments of the present disclosure.

FIG. 17 provides a plan view of an example stacked memory device having peripheral circuitry on a first layer and memory arrays on a second layer, with increased memory density in the second layer, according to some embodiments of the present disclosure. FIG. 17 includes a first layer 1701, which includes the same peripheral device regions as FIGS. 15-16B, and a second layer 1702, which includes the memory arrays 1108. In this example, compared to FIG. 16B, the spaces between groups of memory arrays 1108 are reduced, and the mid-logic 1110 and repeaters 1106 are also shifted so that the mid-logic 1110 aligns with the memory arrays 1108. Furthermore, additional repeaters 1106 are added compared to, e.g., FIG. 16B. FIG. 17 illustrates the memory density that can be achieved by moving the peripheral devices to the first layer 1701. In some embodiments, additional memory arrays 1108 may be added to the second layer 1702 with corresponding peripheral circuitry (e.g., mid-logic 1110 below the memory arrays 1108, and repeaters between the mid-logic 1110) in the first layer 1701.

Figure 18:
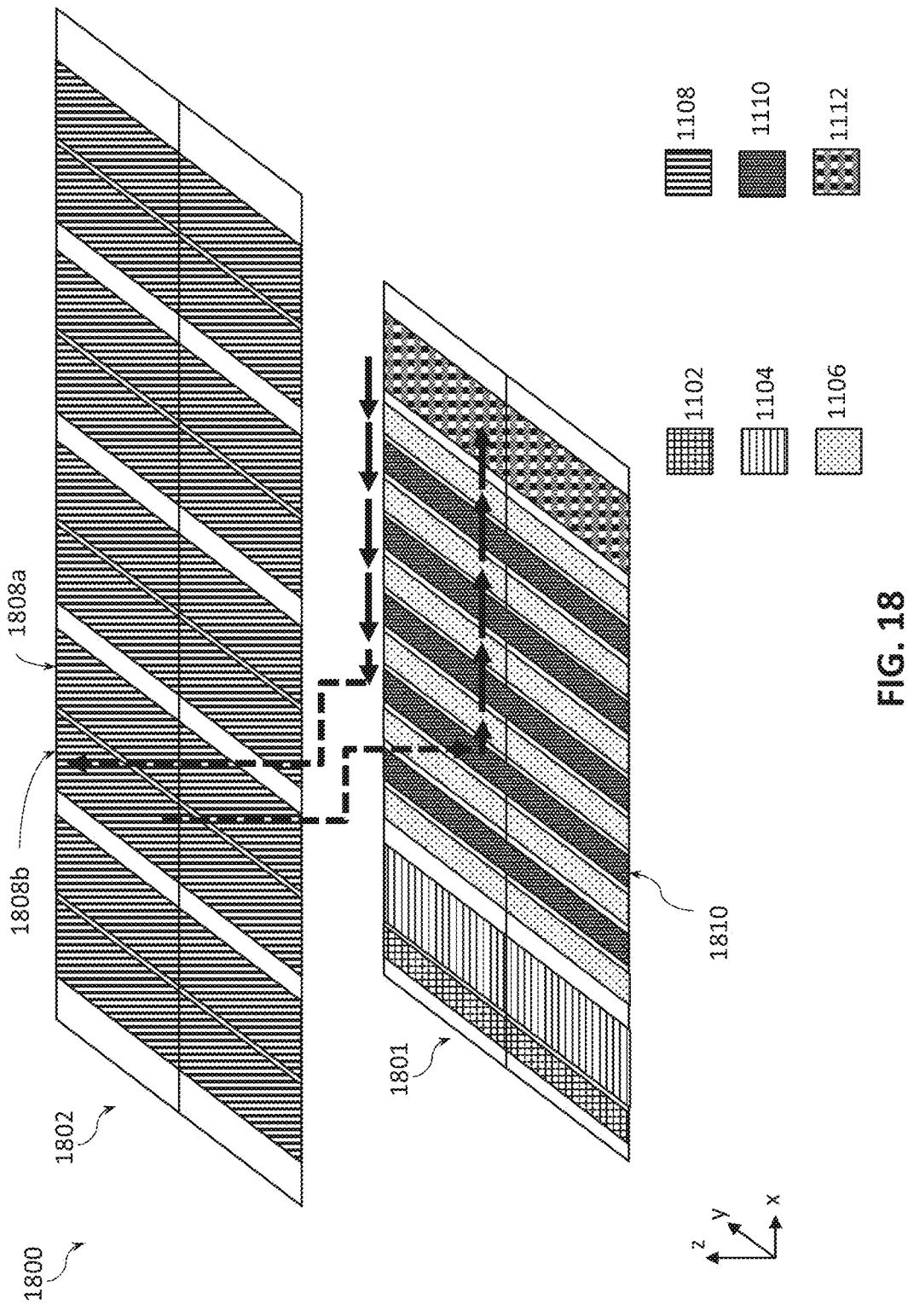
FIG. 18 provides a plan view of an example stacked memory device with additional memory arrays in the memory layer and a smaller die size for the peripheral device layer, according to some embodiments of the present disclosure.

FIG. 18 provides a plan view of an example stacked memory device with additional memory arrays in the memory layer and a smaller die size for the peripheral device layer, according to some embodiments of the present disclosure. As noted above, moving peripheral devices to the peripheral device layer can free up surface area on the memory layer that can be used to add additional memory arrays. FIG. 18 includes a first layer 1801, which includes the same peripheral device regions as FIGS. 15-17, and a second layer 1802, which includes the memory arrays 1108. In this example, the second layer 1802 includes more memory arrays than the previous examples, e.g., 20 memory arrays, rather than the twelve that were illustrated in FIGS. 11-17.

In some embodiments, the surface areas of the stacked layers can be different. For example, the surface area of a peripheral device layer may be smaller than the surface area of the memory layer. To achieve this, the peripheral device layer may be formed on a die having a first surface area, and the memory layer formed on a die having a second surface area, where the second surface area is larger than the first surface area. FIG. 18 is an example with a smaller peripheral device layer 1801 and a larger memory layer 1802. In this example, the peripheral devices are moved closer together, and the mid-logic regions 1110 are smaller than in FIGS. 16A-17. While two layers of different sizes are shown in FIG. 18, it should be understood that additional layers of varying die sizes may be included. For example, a smaller peripheral device layer may support two or more larger memory layers (e.g., the peripheral device layer 940 shown in FIG. 9 may have a smaller surface area than the memory layers 950a and 950b).

In FIG. 18, the mid-logic 1110 are no longer aligned with their associated memory arrays 1108. Communication between the mid-logic 1110 and memory arrays 1108 may traverse a metal layer between the first and second layers 1801 and 1802. FIG. 18 illustrates a data pathway through the memory device 1800. The data pathway proceeds from the I/O circuitry 1112 to the mid-logic regions 1110 via the repeaters 1106 as described above. If a mid-logic region, e.g., mid-logic 1810, determines that the address range in the I/O request is within one of the memory arrays corresponding to the mid-logic 1810, e.g., one of the memory arrays 1808a and 1808b (in this case, 1808b), the mid-logic 1810 transmits the request between the layers 1801 and 1802 to the memory array 1808b. In particular, the request traverses a via (e.g., one or more of the vias 760, or one of the vias 260, 860, or 960), and at least one trench in a metal layer that transmits signals in the x-direction. While the movement in the x-direction is illustrated as between the layers 1801 and 1802, in some embodiments, the request may traverse the memory device 1800 along a different metal layer, e.g., a metal layer above the second layer 1802 or below the first layer 1801. The memory array 1808b may return data stored at the requested memory range, and the data travels back to the I/O circuitry 1112 in a similar manner (e.g., down to the mid-logic 1810 in first layer 1801, through several repeaters 1106, and to the I/O circuitry 1112), as illustrated in FIG. 18.

FIGS. 19A and 19B provides two example plan views of stacked memory devices having one portion of peripheral circuitry on a first layer, another portion of peripheral circuitry on a second layer, and memory arrays on a third layer, according to some embodiments of the present disclosure. FIG. 19A includes two peripheral circuitry layers 1901a and 1902, and the peripheral circuitry is distributed between these layers 1901a and 1902. In this example, the first layer 1901a includes the self-test block 1102 and the I/O circuitry 1112, and the second layer 1902 includes the voltage block 1104, repeaters 1106, and mid-logic 1110. The third layer 1903 includes the memory arrays 1108 and is similar to the second layer 1702 of FIG. 17.

An example data pathway the memory device 1900a is illustrated in FIG. 19A. The data pathway proceeds from the I/O circuitry 1112 in the first layer 1901a to a repeater 1106 in the second layer 1902. A via (e.g., any of the vias shown in FIG. 2, 7, 8, or 9) couples the first layer 1901a to the second layer 1902 and enables signal (and optionally power) transfer between the peripheral device layers 1901a and 1902, in a similar manner to the signal and/or power transfer between the peripheral layers and memory layers, as described above. The pathways across the second layer 1902 and up to the third layer 1903 is similar to the pathways across the first and second layers 1701 and 1702 shown in FIG. 17.

In other embodiments, the peripheral circuitry may be distributed differently from FIG. 19A, e.g., the voltage block 1904 may be included in the first layer 1901a, or the self-test block 1102 may be included in the second layer 1902. Including the I/O circuitry 1112 in a separate layer may be particularly beneficial, because transistors included in the I/O circuitry 1112 is often fabricated with different parameters (e.g., greater channel length and/or thicker gate dielectric) than transistors in other circuits, such as transistors in the memory cells. If other peripheral circuitry (e.g., the self-test block 1102 as shown in FIG. 19A) are included in the same layer 1901a as the I/O circuitry 1112, the same process and parameters may be used across the first layer 1901a.

FIG. 19B shows an alternate embodiment of a memory device 1900b in which the first layer 1901b has a smaller surface area from the second and third layers 1902 and 1903. As noted above, by including peripheral devices on different layers, the layers can be different sizes, and in particular, peripheral device layers may be smaller than memory layers. In this example, the I/O circuitry 1112 and self-test block 1102 are moved together on a die of a much smaller size. In some embodiments, the second peripheral device layer 1902 may also be smaller than the memory layer 1903, e.g., as shown in FIG. 18. Further, in this example, the I/O circuitry 1112 is directly under a mid-logic block 1110, rather than to the side of the mid-logic blocks 1110, as shown in FIG. 19A. This is indicated by the example data pathway, where the arrows between the first layer 1901b and the second layer 1902 go directly between the I/O circuitry 1112 and the mid-logic 1910.

FIGS. 19A and 19B show one example arrangement of the voltage block 1104, repeaters 1106, and mid-logic 1110 in the second layer 1902, and one example arrangement of the memory arrays 1108 in the third layer 1903. The second layer and third layer may alternately have any of the arrangements of peripheral circuitry and memory arrays shown in FIGS. 12-18 with respect to the first and second layer, or any of the arrangements of voltage blocks 1104, repeaters 1106, memory arrays 1108, and mid-logic 1110 described above.

Variations and Implementations

Various device assemblies illustrated in FIGS. 1-19 do not represent an exhaustive set of stacked memory devices as described herein, but merely provide examples of such devices/structures/assemblies. The number and positions of various elements shown in FIGS. 1-19 is purely illustrative and, in various other embodiments, other numbers of these elements, provided in other locations relative to one another may be used in accordance with the general architecture considerations described herein.

Further, FIGS. 1-19 are intended to show relative arrangements of the elements therein, and the device assemblies of these figures may include other elements that are not specifically illustrated (e.g., various interfacial layers). Similarly, although particular arrangements of materials are discussed with reference to FIGS. 1-19, intermediate materials may be included in the IC devices and assemblies of these figures. Still further, although some elements of the various cross-sectional views are illustrated in FIGS. 1-19 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Example Electronic Devices

Arrangements with one or more stacked memory devices as disclosed herein may be included in any suitable electronic device. FIGS. 20-23 illustrate various examples of devices and components that may include one or more three-dimensional memory arrays as disclosed herein.

Figures 20A, 20B:
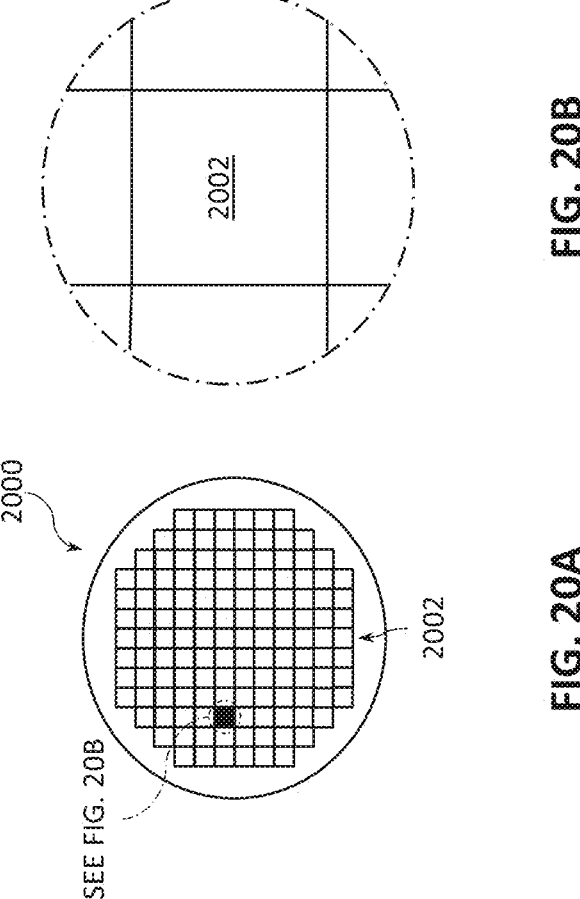
FIGS. 20A and 20B are top views of, respectively, a wafer and dies that may include one or more stacked memory devices in accordance with any of the embodiments disclosed herein.

FIGS. 20A-20B are top views of a wafer 2000 and dies 2002 that may include one or more stacked memory devices in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 21. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more stacked memory devices as described herein). After the fabrication of the semiconductor product is complete (e.g., after manufacture of one or more layers of the stacked memory device as described herein), the wafer 2000 may undergo a singulation process in which each of the dies 2002 is separated from one another to provide discrete "chips" of the semiconductor product. In particular, devices that include one or more stacked memory devices as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., an SRAM device or a DRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 23) or other logic that is configured to store information in the memory devices or execute instructions stored in the memory array.

Figure 21:
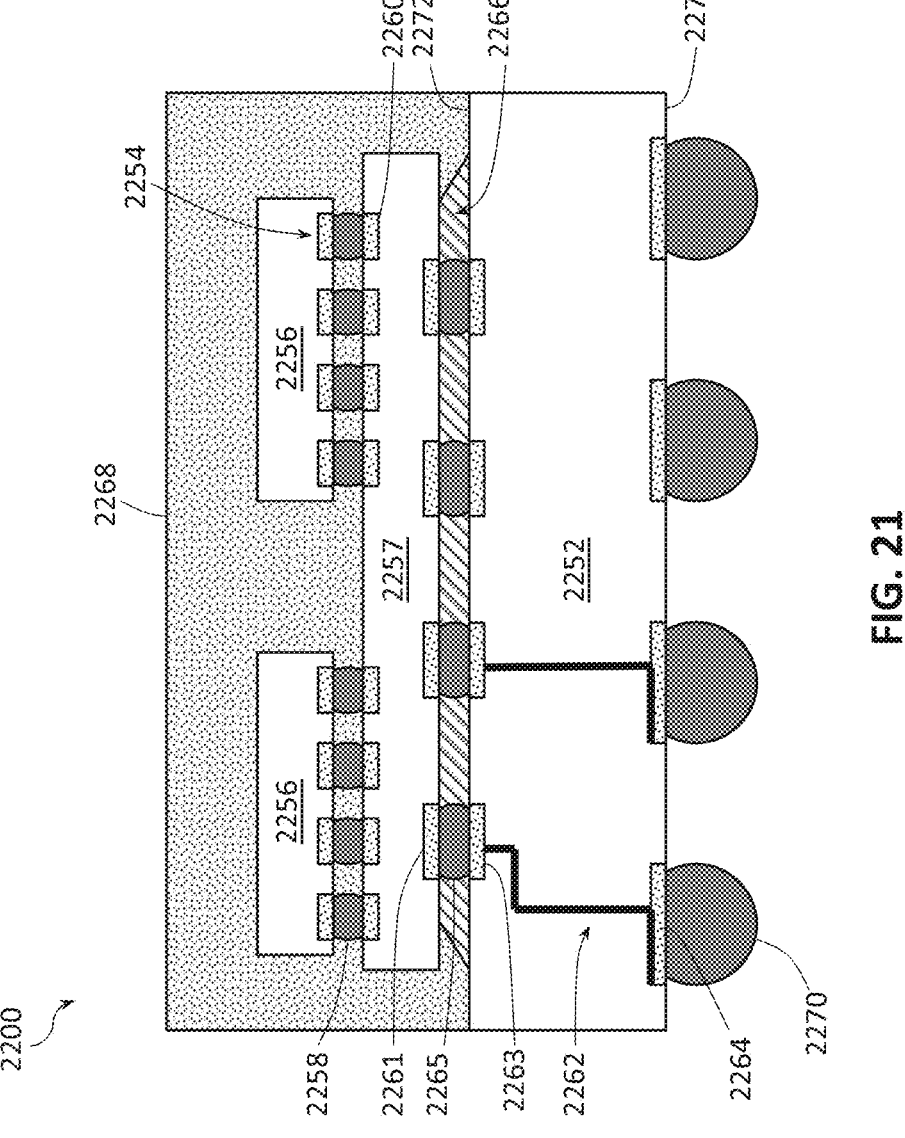
FIG. 21 is a cross-sectional side view of an IC package that may include one or more stacked memory devices in accordance with any of the embodiments disclosed herein.

FIG. 21 is a side, cross-sectional view of an example IC package 2200 that may include one or more stacked memory devices in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 21 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 21 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 21 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 22.

The dies 2256 may take the form of any of the embodiments of the die 2002 discussed herein (e.g., may include any of the embodiments of the stacked memory devices as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more stacked memory devices, e.g., as discussed above; in some embodiments, at least some of the dies 2256 may not include any stacked memory devices devices.

The IC package 2200 illustrated in FIG. 21 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 21, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 22:
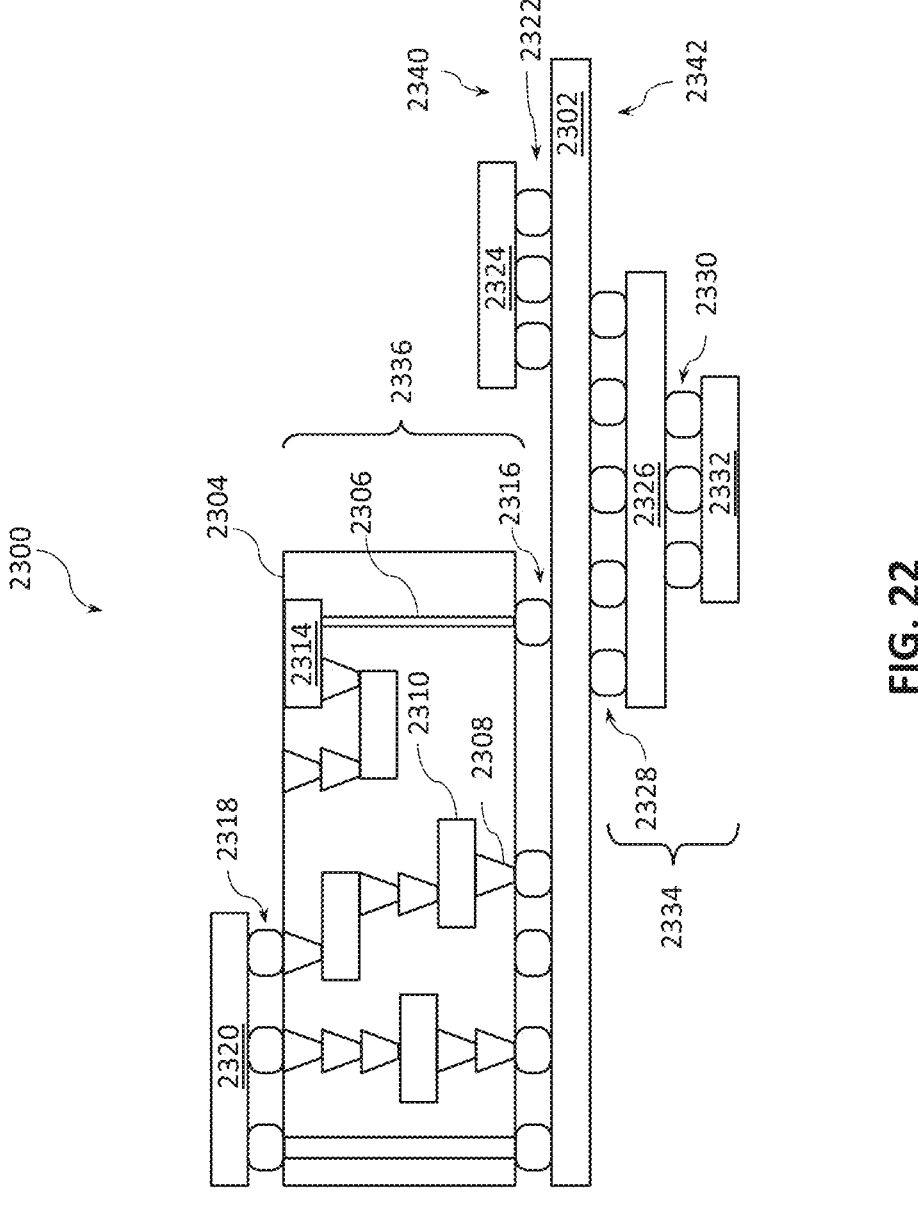
FIG. 22 is a cross-sectional side view of an IC device assembly that may include one or more stacked memory devices in accordance with any of the embodiments disclosed herein.

FIG. 22 is a cross-sectional side view of an IC device assembly 2300 that may include components having one or more stacked memory devices in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more stacked memory devices in accordance with any of the embodiments disclosed herein; e.g., any of the IC packages discussed below with reference to the IC device assembly 2300 may take the form of any of the embodiments of the IC package 2200 discussed above with reference to FIG. 21 (e.g., may include one or more stacked memory devices provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 22 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 22), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 20B), an IC device, or any other suitable component. In particular, the IC package 2320 may include one or more stacked memory devices as described herein. Although a single IC package 2320 is shown in FIG. 22, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 22, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 22 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 23:
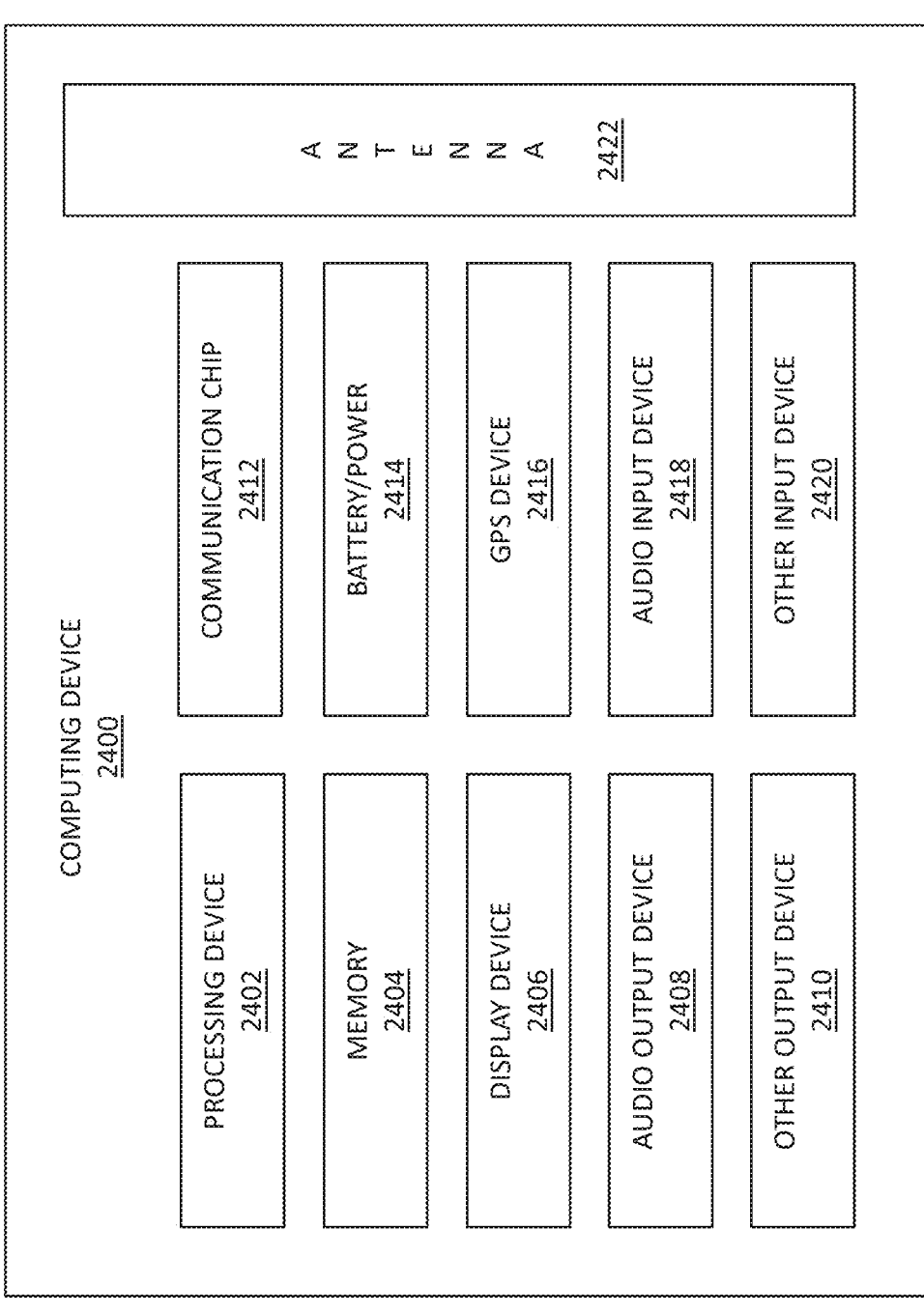
FIG. 23 is a block diagram of an example computing device that may include one or more stacked memory devices in accordance with any of the embodiments disclosed herein.

FIG. 23 is a block diagram of an example computing device 2400 that may include one or more components with one or more stacked memory devices in accordance with any of the embodiments disclosed herein. For example, any suitable ones of the components of the computing device 2400 may include a die (e.g., the die 2002 (FIG. 20B)) including or included in one or more stacked memory devices in accordance with any of the embodiments disclosed herein. Any of the components of the computing device 2400 may include an IC package 2200 (FIG. 21). Any of the components of the computing device 2400 may include an IC device assembly 2300 (FIG. 22).

A number of components are illustrated in FIG. 23 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 23, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), CPUs, GPUs, cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include, for example, a stacked memory device with SRAM or DRAM cells as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include another output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include another input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides a memory device that includes a memory array having a plurality of bitcells; a plurality of peripheral devices coupled to the memory array, the plurality of peripheral devices in a first layer of the memory device, and the memory array in a second layer of the memory device, the second layer over the first layer; and a via coupling the first layer to the second layer.

Example 2 provides the memory device according to example 1, where a first via extends along a first side of the memory array, and a second via extends along a second side of the memory array opposite the first side.

Example 3 provides the memory device according to example 2, where the first via has a first width, and the second via has a second width larger than the first width. For example, the first via is a data via for transferring data between the peripheral device layer and the memory array, and the second via is a power via for transferring power across the first and second layers.

Example 4 provides the memory device according to any of the preceding examples, further including a second memory array in the second layer of the memory device, where the via is positioned between the memory array and the second memory array. For example, the via extends along one side of the first memory array and another side of the second memory array.

Example 5 provides the memory device according to example 1, further including a second memory array, the second memory array in a third layer of the memory device, the third layer over the second layer.

Example 6 provides the memory device according to example 5, where a second via extends from the first layer to the third layer.

Example 7 provides the memory device according to example 6, where the second via couples one of the plurality of peripheral devices to the second memory array.

Example 8 provides the memory device according to example 7, where a width of the second via (where the width is measured in a direction parallel to a face of the first layer) decreases monotonically from the third layer to the first layer. In other words, the via between the third layer and the first layer is continuous, with the width decreasing moving from the third layer down to the first layer.

Example 9 provides the memory device according to example 7, where a width of the second via (where the width is measured in a direction parallel to a face of the first layer) decreases monotonically from the first layer to the third layer. In other words, the via between the third layer and the first layer is continuous, with the width decreasing moving from the first layer to the third layer.

Example 10 provides the memory device according to any of examples 5-9, further including a second plurality of peripheral devices in a fourth layer, the fourth layer between the second layer and the third layer.

Example 11 provides the memory device according to example 10, further including a second vias coupling the fourth layer with the second plurality of peripheral devices to the third layer with the second memory array.

Example 12 provides the memory device according to any of the preceding examples, further including a bonding material between the first layer and the second layer, the via extending through the bonding material.

Example 13 provides the memory device of according to any of the preceding examples, where the plurality of peripheral devices includes a self-test block.

Example 14 provides the memory device of according to any of the preceding examples, where the plurality of peripheral devices includes a voltage block.

Example 15 provides the memory device of according to any of the preceding examples, where the plurality of peripheral devices includes a repeater.

Example 16 provides the memory device of according to any of the preceding examples, where the plurality of peripheral devices includes mid-logic.

Example 17 provides the memory device of according to any of the preceding examples, where the plurality of peripheral devices includes input and output circuitry.

Example 18 provides memory device including a first layer including input and output (I/O) circuitry; a second layer including a repeater; and a third layer including at least one memory array, the second layer between the first layer and the third layer.

Example 19 provides the memory device according to example 18, where transistor in the I/O circuitry in the first layer has a first gate height, and a transistor in a memory cell in the third layer has a second gate height less than the first gate height.

Example 20 provides the memory device according to example 18 or 19, where a transistor in the I/O circuitry in the first layer has a first channel length, and a transistor in a memory cell in the third layer has a second channel length less than the first channel length.

Example 21 provides the memory device according to any of examples 18-20, where the first layer further includes a self-test block.

Example 22 provides the memory device according to any of examples 18-21, where the first layer further includes a voltage block, the voltage block including at least one capacitor.

Example 23 provides the memory device according to any of examples 18-21, the second layer further including a voltage block, the voltage block including at least one capacitor.

Example 24 provides the memory device according to example 23, where the second layer further includes at least one mid-logic circuit.

Example 25 provides the memory device according to example 23 or 24, where the second layer further includes a self-test block.

Example 26 provides the memory device according to any of examples 18-22, where the second layer further includes mid-logic, the mid-logic including an address decoder.

Example 27 provides the memory device according to example 26, where at least a portion of a mid-logic block in the second layer is aligned with at least a portion of a memory array in the third layer.

Example 28 provides the memory device according to any of examples 18-23, where the third layer further includes mid-logic, the mid-logic including an address decoder.

Example 29 provides the memory device according to example 28, where the mid-logic block in the third layer is at least partially aligned with the repeater in the second layer.

Example 30 provides the memory device according to any of examples 18-29, where a memory array in the third layer includes a transistor-based memory cell, i.e., an SRAM cell.

Example 31 provides the memory device according to any of examples 18-29, where a memory cell in a memory array in the third layer is a DRAM cell that includes one transistor and one capacitor.

Example 32 provides an IC device including a processing unit and a memory structure coupled to the processing unit, the memory structure including a memory layer including a memory array, the memory array including a plurality of bitcells; and a peripheral device layer including peripheral devices, at least one peripheral device coupled to the memory array, and at least one peripheral device coupled to the processing unit.

Example 33 provides the IC device according to example 32, where the memory structure includes a via coupling the peripheral device layer to the memory structure.

Example 34 provides the IC device according to example 32 or 33, where the processing unit is a central processing unit.

Example 35 provides the IC device according to example 32 or 33, where the processing unit is a graphics processing unit.

Example 36 provides the IC device according to any of examples 32-35, where the peripheral device layer includes a voltage block and at least one repeater.

Example 37 provides the IC device according to any of examples 32-36, where the peripheral device layer further includes mid-logic, the mid-logic including an address decoder.

Example 38 provides the IC device according to any of examples 32-37, where the peripheral device layer further includes input and output (I/O) circuitry, the I/O circuitry coupled to the processing unit.

Example 39 provides a computing device that includes a circuit board; and an IC die coupled to the circuit board, where the IC die includes one or more of the memory/IC devices according to any one of the preceding examples (e.g., memory/IC devices according to any one of examples 1-38), and/or the IC die is included in the IC package according to any one of the preceding examples (e.g., the IC package according to any one of examples 26-29).

Example 40 provides the computing device according to example 39, where the computing device is a wearable computing device (e.g., a smart watch) or handheld computing device (e.g., a mobile phone).

Example 41 provides the computing device according to examples 39 or 40, where the computing device is a server processor.

Example 42 provides the computing device according to examples 39 or 40, where the computing device is a motherboard.

Example 43 provides the computing device according to any one of examples 39-42, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A memory device comprising:
   a first memory array comprising a first plurality of bitcells;
   a first plurality of peripheral devices coupled to the first memory array, the first plurality of peripheral devices in a first layer of the memory device, and the first memory array in a second layer of the memory device, the second layer over the first layer;
   a first via coupling the first layer to the second layer;
   a second memory array comprising a second plurality of bitcells;
   a second plurality of peripheral devices coupled to the second memory array, the second plurality of peripheral devices in a third layer of the memory device, and the second memory array in a fourth layer of the memory device, the third layer between the second layer and the fourth layer; and a second via coupling the third layer to a fifth layer, wherein the first layer and the second layer are between the third layer and the fifth layer.

2. The memory device of claim 1, wherein a first via extends along a first side of the first memory array, and a second via extends along a second side of the first memory array opposite the first side.

3. The memory device of claim 2, wherein the first via has a first width, and the second via has a second width larger than the first width.

4. The memory device of claim 1, wherein a second via extends from the fourth layer to the third layer.

5. The memory device of claim 4, wherein the second via couples one of the second plurality of peripheral devices to the second memory array, and a width of the second via decreases monotonically from the fourth layer to the third layer.

6. The memory device of claim 1, further comprising a bonding material between the first layer and the second layer, the first via extending through the bonding material.

7. The memory device of claim 1, wherein the first plurality of peripheral devices comprises at least one of a self-test block, a voltage block, a repeater, mid-logic, and input and output circuitry.

8. The memory device of claim 1, wherein the fifth layer comprises processing circuitry.

9. The memory device of claim 1, wherein the fifth layer comprises a plurality of interconnects.

10. A device comprising:

a first plurality of peripheral devices in a first layer of the device;

a first memory array comprising a plurality of bitcells, the first memory array in a second layer of the device, the second layer over the first layer;

a first via coupling the first layer to the second layer;

a second plurality of peripheral devices in a third layer of the device, wherein the second layer comprising the first memory array is between the first layer comprising the first plurality of peripheral devices and the third layer comprising the second plurality of peripheral devices; and a second via coupled to the third layer and to a fourth layer, wherein the first layer and the second layer are between the third layer and the fourth layer, and the second via extends through the first layer and the second layer.

11. The device of claim 10, further comprising a second memory array in a fifth layer of the device, the third layer between the second layer and the fifth layer.

12. The device of claim 11, further comprising a third via coupled between the second plurality of peripheral devices in the third layer and the second memory array in the fifth layer.

13. The device of claim 10, further comprising a third via coupled between the second layer comprising the first memory array and the third layer comprising the second plurality of peripheral devices.

14. The device of claim 13, wherein the third via is one of a vertical stack of vias.

15. The device of claim 10, wherein the first layer has a different footprint from the second layer.

16. The device of claim 10, wherein the first layer has a smaller footprint than the first layer.

17. The device of claim 10, wherein the second layer further comprises a second memory array, and the second via is between the first memory array and the second memory array.

18. The device of claim 10, wherein the fourth layer is a metal layer.

19. The device of claim 18, wherein the metal layer is over a logic layer.

20. The device of claim 19, wherein the logic layer comprises a plurality of transistors.

* * * * *